US009299569B2

(12) United States Patent
Kawashima et al.

(10) Patent No.: US 9,299,569 B2
(45) Date of Patent: Mar. 29, 2016

(54) MANUFACTURING METHOD OF SEMICONDUCTOR DEVICE

(71) Applicant: Renesas Electronics Corporation, Kawasaki-shi, Kanagawa (JP)

(72) Inventors: Yoshiyuki Kawashima, Kanagawa (JP); Kentaro Saito, Kanagawa (JP); Hiraku Chakihara, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/801,798

(22) Filed: Jul. 16, 2015

(65) Prior Publication Data

US 2016/0027651 A1  Jan. 28, 2016

(30) Foreign Application Priority Data

Jul. 28, 2014 (JP) ................................ 2014-153344

(51) Int. Cl.
*H01L 27/115* (2006.01)
*H01L 21/28* (2006.01)
*H01L 29/40* (2006.01)

(52) U.S. Cl.
CPC ...... *H01L 21/28282* (2013.01); *H01L 27/1157* (2013.01); *H01L 27/11563* (2013.01); *H01L 27/11573* (2013.01); *H01L 27/11575* (2013.01); *H01L 29/401* (2013.01)

(58) Field of Classification Search
CPC ................. H01L 27/11573; H01L 27/11575; H01L 27/11563
See application file for complete search history.

(56) References Cited

U.S. PATENT DOCUMENTS 7,303,951 B2  12/2007  Kanamitsu et al.

FOREIGN PATENT DOCUMENTS

JP      2005-203508 A   7/2005

*Primary Examiner* — Amar Movva
(74) *Attorney, Agent, or Firm* — Shapiro, Gabor and Rosenberger, PLLC

(57) ABSTRACT

The present invention improves the performance of a semiconductor device. In a manufacturing method of a semiconductor device, sacrificial oxide films are formed over the side surface of a control gate electrode formed in a memory cell region, the surface of a cap insulating film formed in the memory cell region, and the surface of the part, which remains in a peripheral circuit region, of an insulating film. The step of forming the sacrificial oxide films includes the steps of: oxidizing the side surface of the control gate electrode by a thermal oxidation method; and oxidizing the surface of the cap insulating film and the surface of the part, which remains in the peripheral circuit region, of the insulating film by an ISSG oxidation method.

15 Claims, 21 Drawing Sheets

| OPERATION \ APPLIED VOLTAGE | Vd | Vcg | Vmg | Vs | Vb |
|---|---|---|---|---|---|
| WRITE | Vdd | 1V | 12V | 6V | 0 |
| ERASURE | 0 | 0 | -6V | 6V | 0 |
| READOUT | Vdd | Vdd | 0 | 0 | 0 |

Vdd = 1.5V

MANUFACTURING METHOD OF SEMICONDUCTOR DEVICE

CROSS-REFERENCE TO RELATED APPLICATIONS

The disclosure of Japanese Patent Application No. 2014-153344 filed on Jul. 28, 2014 including the specification, drawings and abstract is incorporated herein by reference in its entirety.

BACKGROUND

The present invention relates to a manufacturing method of a semiconductor device and, for example, is preferably applicable to a manufacturing method of a semiconductor device having a semiconductor element formed over a semiconductor substrate.

A semiconductor device having a memory cell region in which a memory cell such as a non-volatile memory or the like is formed over a semiconductor substrate for example and a peripheral circuit region in which a peripheral circuit comprised of a MISFET (Metal Insulator Semiconductor Field Effect Transistor) or the like is formed over the semiconductor substrate for example is widely used.

There sometimes is a case where a memory cell comprised of a split gate type cell using a MONOS (Metal-Oxide-Nitride-Oxide-Semiconductor) film is formed as a non-volatile memory for example. In such a case, the memory cell comprises two MISFETs of a control transistor having a control gate electrode and a memory transistor having a memory gate electrode.

As a manufacturing method of such a semiconductor device, there is a method including the steps of: forming a resist pattern comprising a photoresist film (hereunder merely referred to as a resist film) over an etching film formed over the surface of a semiconductor substrate; and etching and patterning the etching film with the formed resist pattern used as a mask.

In Japanese Unexamined Patent Application Publication No. 2005-203508 (Patent Literature 1), disclosed is a technology of, in a step of forming an element isolation trench in a semiconductor device: depositing a silicon nitride film over the surface of a silicon substrate with a silicon oxide film interposed; and removing the silicon nitride film in an element isolation region by dry etching with a photoresist film used as a mask.

CITATION LIST

Patent Literature

Patent Literature 1: Japanese Unexamined Patent Application Publication No. 2005-203508

SUMMARY

In a manufacturing step of a semiconductor device having a memory cell region and a peripheral circuit region for example, a conductive film and an insulating film are formed in sequence over a semiconductor substrate in the memory cell region and the peripheral circuit region. Successively, the insulating film and the conductive film are patterned and a control gate electrode comprising the conductive film and a cap insulating film comprising the insulating film over the control gate electrode are formed in the memory cell region. Meanwhile, the conductive film and the insulating film over the conductive film remain in the peripheral circuit region. Successively, a sacrificial oxide film is formed over the side surface of the gate electrode. Successively, the insulating film is etched and the part, which remains in the peripheral circuit region, of the insulating film is removed. Successively, the sacrificial oxide film formed over the side surface of the gate electrode is removed, the conductive film is patterned, and a gate electrode comprising the conductive film is formed in the peripheral circuit region.

In such a manufacturing step of a semiconductor device, it may sometimes happen that a foreign substance adheres to the top surface of the part, which remains in a peripheral circuit region, of an insulating film after a control gate electrode and a cap insulating film are formed and before the part, which remains in the peripheral circuit region, of the insulating film is removed. In such a case, the part, to the top surface of which the foreign substance adheres, of the insulating film remains without being etched when the insulating film is etched. As a result, when a conductive film is patterned successively, the part of the conductive film located under the part, to the top surface of which the foreign substance adheres, of the insulating film remains. If the part to be removed of the conductive film remains in this way, the semiconductor device comes to be defective and the performance of the semiconductor device cannot be improved.

Other problems and novel features will be obvious from the descriptions and attached drawings in the present specification.

According to an embodiment, in a manufacturing method of a semiconductor device: a conductive film comprising silicon and an insulating film containing silicon and nitrogen are formed over a semiconductor substrate in a first region and a second region; and the insulating film and the conductive film are patterned, a control gate electrode comprising the conductive film is formed, and a cap insulating film comprising the insulating film over the control gate electrode is formed in the first region. Successively, sacrificial oxide films are formed over the side surface of the control gate electrode, the surface of the cap insulating film, and the surface of the part, which remains in the second region, of the insulating film. The step of forming the sacrificial oxide films includes: a step of oxidizing the side surface of the control gate electrode by a thermal oxidation method; and a step of oxidizing the surface of the cap insulating film and the surface of the part, which remains in the second region, of the insulating film by an ISSG oxidation method. Successively, the insulating film is removed, the conductive film is patterned, and a gate electrode comprising the conductive film is formed in the second region.

According to an embodiment, it is possible to improve the performance of a semiconductor device.

DETAILED DESCRIPTION

Figure 1:
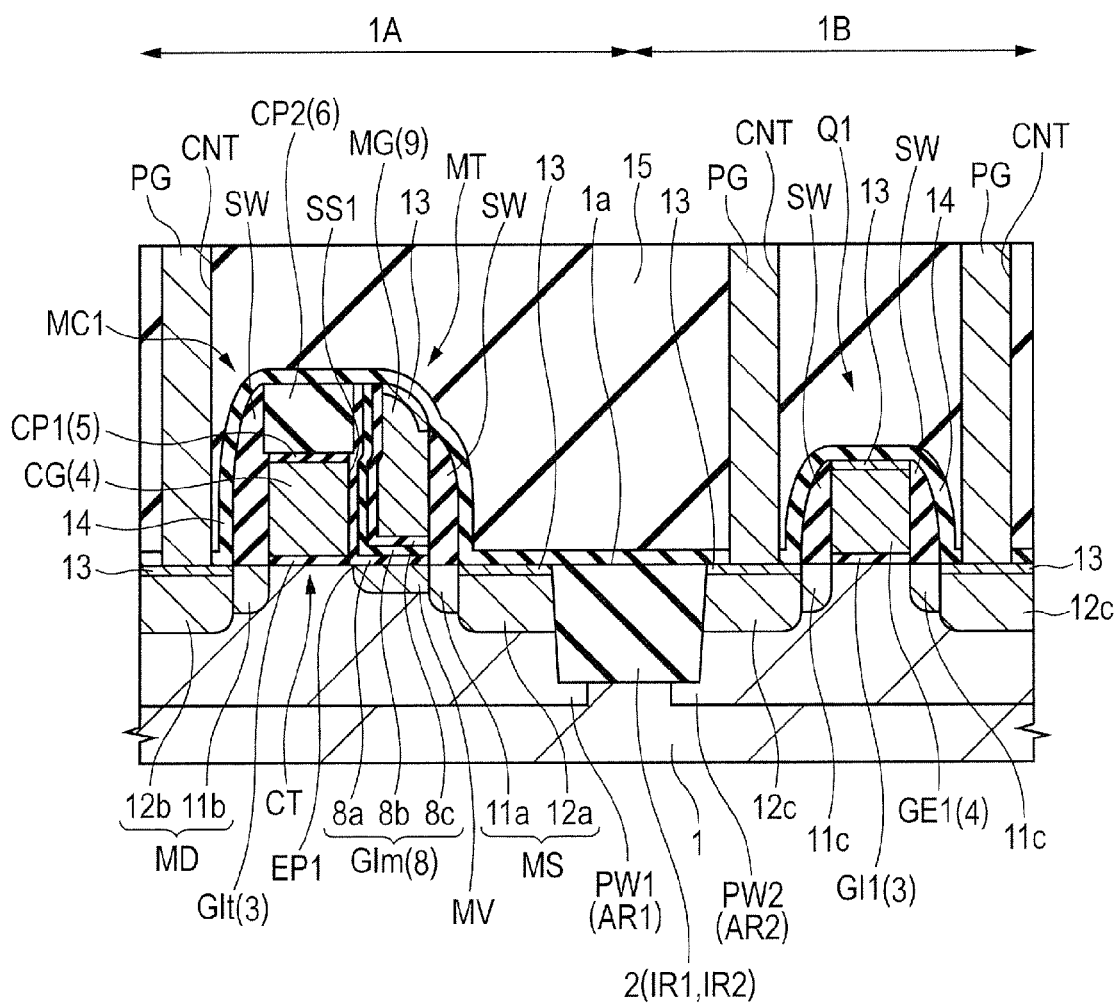
FIG. 1 is a sectional view showing a substantial part of a semiconductor device according to Embodiment 1.

In the following embodiments, if necessary for convenience sake, each of the embodiments is explained by dividing it into plural sections or embodiments but, unless otherwise specified, they are not unrelated to each other and are in the relationship of one being a modified example, a detail, a supplemental explanation, or the like of a part or the whole of another.

Further in the following embodiments, when the number of elements and others (including the number of pieces, a numerical value, a quantity, a range, and others) are referred to, except the cases of being specified and being limited obviously to a specific number in principle and other cases, the number is not limited to a specific number and may be larger or smaller than the specific number.

Furthermore in the following embodiments, it goes without saying that the constituent components (including a component step and others) are not necessarily essential except the cases of being specified and being obviously thought to be essential in principle and other cases. Likewise in the following embodiments, when a shape, positional relationship, and the like of a constituent component or the like are referred to, they substantially include those approximate or similar to the shape and the like except the cases of being specified and being obviously thought to be otherwise in principle and other cases. The same goes for the numerical value and the range.

Representative embodiments are hereunder explained in detail in reference to the drawings. Further, in all the drawings for explaining the embodiments, members having identical function are represented with an identical code and are not explained repeatedly. Further, in the following embodiments, identical or similar parts are not explained repeatedly in principle except when particularly needed.

Further, in the drawings used in the embodiments, hatching may sometimes be omitted even in a sectional view in order to make a drawing easy to understand.

Embodiment 1

Structure of Semiconductor Device

Figures 2, 3:
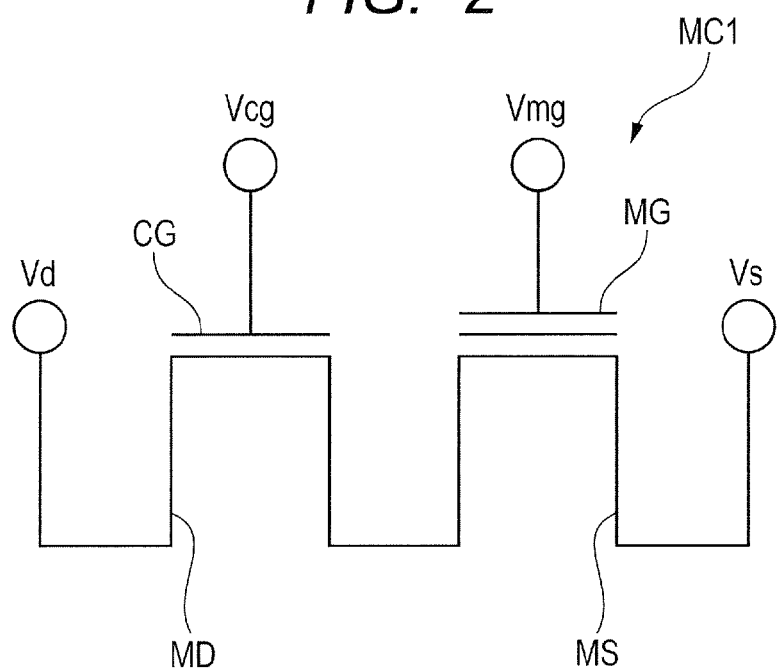
FIG. 2 is an equivalent circuit schematic of a memory cell in a semiconductor device according to Embodiment 1.
FIG. 3 is a table showing an example of conditions for applying voltages to sections of a memory cell at the time of "write", "erasure", and "readout".

The structure of a semiconductor device according to Embodiment 1 is explained hereunder in reference to the drawings. FIG. 1 is a sectional view showing a substantial part of a semiconductor device according to Embodiment 1. FIG. 2 is an equivalent circuit schematic of a memory cell in a semiconductor device according to Embodiment 1.

As shown in FIG. 1, a semiconductor device has a semiconductor substrate 1. The semiconductor substrate 1 is a semiconductor wafer comprising p-type monocrystal silicon having a resistivity of about 1 to 10 Ωcm or the like for example.

The semiconductor device has a memory cell region 1A and a peripheral circuit region 1B as the partial regions of a main surface 1a of the semiconductor substrate 1. A memory cell MC1 is formed in the memory cell region 1A and a MISFET Q1 is formed in the peripheral circuit region 1B. The memory cell region 1A and the peripheral circuit region 1B may not be adjacent to each other but, for making the drawing easy to understand, the peripheral circuit region 1B is shown adjacently to the memory cell region 1A in the sectional view of FIG. 1. Here, a peripheral circuit is a circuit other than a non-volatile memory and is a processor such as a CPU (Central Processing Unit), a control circuit, a sense amplifier, a column decoder, a row decoder, an I/O circuit, or the like for example. The MISFET Q1 formed in the peripheral circuit region 1B is a MISFET for the peripheral circuit.

Firstly, the configuration of the memory cell MC1 formed in the memory cell region 1A is explained concretely.

The semiconductor device has an active region AR1 and an element isolation region IR1 in the memory cell region 1A. The element isolation region IR1 is a region for isolating an element and an element isolation film 2 is formed in the element isolation region IR1. The active region AR1 is specified, namely partitioned, by the element isolation region IR1 and electrically separated from another active region by the element isolation region IR1 and a p-type well PW1 is formed in the active region AR1. That is, the active region AR1 is a region in which the p-type well PW1 is formed. The p-type well PW1 has an conductive type of a p-type.

As shown in FIG. 1, the memory cell MC1 comprised of a memory transistor MT and a control transistor CT is formed in the p-type well PW1 in the memory cell region 1A. A plurality of memory cells MC1 are formed in an array in an actual memory cell region 1A but a cross section of one of the memory cells MC1 is shown in FIG. 1. The memory cell MC1 is included in a non-volatile memory installed in the semiconductor device.

The memory cell MC1 as the non-volatile memory is a memory cell of a split gate type. That is, as shown in FIG. 1, the memory cell MC1 has: the control transistor CT having a control gate electrode CG; and the memory transistor MT being coupled to the control transistor CT and having a memory gate electrode MG.

As shown in FIG. 1, the memory cell MC1 as the non-volatile memory has an n-type semiconductor region MS, an n-type semiconductor region MD, an n-type semiconductor region MV, the control gate electrode CG, and the memory gate electrode MG. The n-type semiconductor region MS, the n-type semiconductor region MD, and the n-type semiconductor region MV have the conductive type of an n-type that is opposite to the p-type. Further, the memory cell MC1 as the non-volatile memory has a cap insulating film CP1 formed over the control gate electrode CG and a cap insulating film CP2 formed over the cap insulating film CP1. Furthermore, the memory cell MC1 as the non-volatile memory has a gate insulating film GIt formed between the control gate electrode CG and the semiconductor substrate 1 and a gate insulating film GIm formed between the memory gate electrode MG and the semiconductor substrate 1 and between the memory gate electrode MG and the control gate electrode CG.

The control gate electrode CG and the memory gate electrode MG extend along the main surface 1a of the semiconductor substrate 1 and are arranged side-by-side in the state of interposing the gate insulating film GIm between the opposing side surfaces, namely between the opposing sidewalls. The direction in which the control gate electrode CG and the memory gate electrode MG extend is a direction vertical to the sheet plane of FIG. 1. The control gate electrode CG is formed over the part, which is located between the semiconductor region MD and the semiconductor region MS, of the p-type well PW1, namely over the semiconductor substrate 1, with the gate insulating film GIt interposed. Further, the memory gate electrode MG is formed over the part, which is located between the semiconductor region MD and the semiconductor region MS, of the p-type well PW1, namely over the semiconductor substrate 1, with the gate insulating film GIm interposed. Furthermore, the memory gate electrode MG is arranged on the side of the semiconductor region MS and the control gate electrode CG is arranged on the side of the semiconductor region MD. The control gate electrode CG and the memory gate electrode MG are gate electrodes configuring the memory cell MC1, namely the non-volatile memory.

Here, the cap insulating film CP1 and the cap insulating film CP2 formed over the control gate electrode CG also extend along the main surface 1a of the semiconductor substrate 1.

The control gate electrode CG and the memory gate electrode MG are adjacent to each other with the gate insulating film GIm interposed in between and the memory gate electrode MG is formed in the shape of a sidewall spacer over the side surface, namely over the sidewall, of the control gate electrode CG with the gate insulating film GIm interposed. Further, the gate insulating film GIm extends over both the regions comprising a region between the memory gate electrode MG and the p-type well PW1 in the semiconductor substrate 1 and a region between the memory gate electrode MG and the control gate electrode CG.

The gate insulating film GIt formed between the control gate electrode CG and the p-type well PW1 functions as a gate insulating film of the control transistor CT. Further, the gate insulating film GIm formed between the memory gate electrode MG and the p-type well PW1 functions as a gate insulating film of the memory transistor MT.

The gate insulating film GIt comprises an insulating film 3. The insulating film 3 comprises a silicon oxide film, a silicon nitride film, a silicon oxynitride film, or a high permittivity film, namely a so-called High-k film, having a specific permittivity higher than a silicon nitride film. Meanwhile, in the present application, when a High-k film or a high permittivity film is referred to, it means a film having a permittivity (specific permittivity) higher than silicon nitride. As the insulating film 3, a metal oxide film such as a hafnium oxide film, a zirconium oxide film, an aluminum oxide film, a tantalum oxide film, or a lanthanum oxide film can be used for example.

The gate insulating film GIm comprises an insulating film 8. The insulating film 8 comprises a laminated film including a silicon oxide film 8a, a silicon nitride film 8b as a charge accumulation section over the silicon oxide film 8a, and a silicon oxide film 8c over the silicon nitride film 8b. Here, the gate insulating film GIm between the memory gate electrode MG and the p-type well PW1 functions as the gate insulating film of the memory transistor MT as stated earlier. Meanwhile, the gate insulating film GIm between the memory gate electrode MG and the control gate electrode CG functions as an insulating film to insulate, namely to electrically isolate, the memory gate electrode MG from the control gate electrode CG.

In the insulating film 8, the silicon nitride film 8b is an insulating film to accumulate electric charge and functions as the charge accumulation section. That is, the silicon nitride film 8b is a trap insulating film formed in the insulating film 8. Consequently, the insulating film 8 can be regarded as an insulating film having a charge accumulation section in the interior.

The silicon oxide film 8c and the silicon oxide film 8a located over and under the silicon nitride film 8b can function as charge block layers to trap electric charge. By adopting a structure where the silicon nitride film 8b is interposed between the silicon oxide film 8c and the silicon oxide film 8a, it is possible to accumulate electric charge in the silicon nitride film 8b. The silicon oxide film 8a, the silicon nitride film 8b, and the silicon oxide film 8c can also be regarded as an ONO (Oxide-Nitride-Oxide) film.

The control gate electrode CG comprises a conductive film 4. The conductive film 4 comprises silicon and for example comprises an n-type polysilicon film that is a polycrystal silicon film into which impurities of an n-type are introduced or the like. Concretely, the control gate electrode CG comprises a patterned conductive film 4.

The memory gate electrode MG comprises a conductive film 9. The conductive film 9 comprises silicon and for example comprises an n-type polysilicon film that is a polycrystal silicon film into which impurities of an n-type are introduced or the like. The memory gate electrode MG is formed by: etching anisotropically, namely etching back, the conductive film 9 formed over the semiconductor substrate 1 so as to cover the control gate electrode CG; and leaving the conductive film 9 over a sidewall of the control gate electrode CG with the insulating film 8 interposed. Consequently, the memory gate electrode MG is formed in the shape of a sidewall spacer over the sidewall located on a first side of the control gate electrode CG adjacent to the memory gate electrode MG with the insulating film 8 interposed.

The cap insulating film CP1 comprises an insulating film 5 containing silicon and oxygen. The insulating film 5 comprises a silicon oxide film or the like for example. The cap insulating film CP2 comprises an insulating film 6 containing silicon and nitrogen. The insulating film 6 comprises a silicon nitride film or the like for example.

The cap insulating film CP2 is: a protective film to protect the control gate electrode CG; a hard mask used when the conductive film 4 is patterned and the control gate electrode CG is formed; and a spacer film to adjust the height of the top surface of the memory gate electrode MG when the conductive film 9 is etched back and the memory gate electrode MG is formed.

The semiconductor region MS is a semiconductor region functioning as either one of a source region or a drain region and the semiconductor region MD is a semiconductor region functioning as the other one of the source region or the drain region. Here, the semiconductor region MS is a semiconductor region functioning as a source region for example and the semiconductor region MD is a semiconductor region functioning as a drain region for example. Each of the semiconductor region MS and the semiconductor region MD comprises a semiconductor region into which impurities of an n-type are introduced and has an LDD (Lightly Doped Drain) structure.

The semiconductor region MS for a source has an $n^-$-type semiconductor region 11a and an $n^+$-type semiconductor region 12a having an impurity concentration higher than the $n^-$-type semiconductor region 11a. Further, the semiconductor region MD for a drain has an $n^-$-type semiconductor region 11b and an $n^+$-type semiconductor region 12b having an impurity concentration higher than the $n^-$-type semiconductor region 11b. The $n^+$-type semiconductor region 12a has a junction depth deeper and an impurity concentration higher than the $n^-$-type semiconductor region 11a and the $n^+$-type semiconductor region 12b has a junction depth deeper and an impurity concentration higher than the $n^-$-type semiconductor region 11b.

Over the sidewalls of the memory gate electrode MG and the control gate electrode CG on the sides not adjacent to each other, sidewall spacers SW comprising an insulating film such as a silicon oxide film, a silicon nitride film, or a laminated film of those are formed, respectively. That is, the sidewall spacers SW are formed: over the sidewall, namely over the side surface, of the memory gate electrode MG on the side opposite to the side adjacent to the control gate electrode CG with the gate insulating film GIm interposed; and over the sidewall, namely over the side surface, of the control gate electrode CG on the side opposite to the side adjacent to the memory gate electrode MG with the gate insulating film GIm interposed.

Here, sidewall insulating films not shown in the figure may be interposed between the memory gate electrode MG and the sidewall spacer SW, between the control gate electrode CG and the sidewall spacer SW, and between the control gate electrode CG and the gate insulating film GIm.

The $n^-$-type semiconductor region 11a is formed self-alignedly to the side surface of the memory gate electrode MG and the $n^+$-type semiconductor region 12a is formed self-alignedly to the side surface of the sidewall spacer SW. Consequently, the $n^-$-type semiconductor region 11a of a low concentration is formed under the sidewall spacer SW over the sidewall of the memory gate electrode MG and the $n^+$-type semiconductor region 12a of a high concentration is formed outside the $n^-$-type semiconductor region 11a of a low concentration. As a result, the $n^+$-type semiconductor region 12a of a high concentration is formed so as to be in contact with the $n^-$-type semiconductor region 11a of a low concentration.

The $n^-$-type semiconductor region 11b is formed self-alignedly to the side surface of the control gate electrode CG and the $n^+$-type semiconductor region 12b is formed self-alignedly to the side surface of the sidewall spacer SW. Consequently, the $n^-$-type semiconductor region 11b of a low concentration is formed under the sidewall spacer SW over the sidewall of the control gate electrode CG and the $n^+$-type semiconductor region 12b of a high concentration is formed outside the $n^-$-type semiconductor region 11b of a low concentration. As a result, the $n^-$-type semiconductor region 11b of a low concentration is formed so as to be adjacent to the p-type well PW1 as a channel region of the control transistor CT. Further, the $n^+$-type semiconductor region 12b of a high concentration is formed so as to be in contact with the $n^-$-type semiconductor region 11b of a low concentration and be separated from the p-type well PW1 as the channel region of the control transistor CT to the extent corresponding to the n⁻-type semiconductor region 11b.

The semiconductor region MV is formed at the upper layer part of the part, which is located under the gate insulating film GIm under the memory gate electrode MG, of the p-type well PW1. The semiconductor region MV comprises a semiconductor region into which impurities of an n-type are introduced. The semiconductor region MV is used for injecting electrons into the silicon nitride film 8b in the gate insulating film GIm by a source side injection method that will be described later. The semiconductor region MV is in contact with the semiconductor region MS for a source. Consequently, the n⁻-type semiconductor region 11a of a low concentration is formed so as to be adjacent to the semiconductor region MV. Further, the n⁺-type semiconductor region 12a of a high concentration is formed so as to be separated from the p-type well PW1 as the cannel region of the control transistor CT to the extent corresponding to the semiconductor region MV and the n⁻-type semiconductor region 11a.

The semiconductor region MV that is an n-type semiconductor region is electrically coupled to the semiconductor region MS for a source that is an n-type semiconductor region. Further, a p-n junction is formed by the semiconductor region MV that is an n-type semiconductor region and the p-type well PW1 in the vicinity of an end EP1 that is the end of the semiconductor region MV on the center side of the control gate electrode CG. Then electrons are generated mainly at the p-n junction by applying voltage between the semiconductor region MS for a source and the semiconductor region MV electrically coupled to the semiconductor region MS for a source and the p-type well PW1.

Preferably, it is desirable to arrange the end EP1 of the semiconductor region MV on the center side of the control gate electrode CG closer to the memory gate electrode MG than a side surface SS1 of the control gate electrode CG on the side of the memory gate electrode MG in plan view. That is, it is desirable to form the semiconductor region MV so as to be separated from the control gate electrode CG in plan view. As a result, it is possible to efficiently inject electrons generated mainly at the p-n junction into the silicon nitride film 8b in the gate insulating film GIm by source side injection.

A channel region of the control transistor CT is formed at the upper layer part of the part, which is located under the gate insulating film GIt under the control gate electrode CG, of the p-type well PW1.

A metal silicide layer 13 is formed over the n⁺-type semiconductor region 12a or over the n⁺-type semiconductor region 12b, namely over the top surface of the n⁺-type semiconductor region 12a or the n⁺-type semiconductor region 12b, by a Salicide (Self Aligned Silicide) technology or the like. The metal silicide layer 13 comprises a cobalt silicide layer, a nickel silicide layer, a platinum-added nickel silicide layer, or the like for example. It is possible to reduce diffusion resistance and contact resistance by the metal silicide layer 13.

Here, it is also possible to form the metal silicide layer 13 over the memory gate electrode MG.

The configuration of a MISFET Q1 formed in the peripheral circuit region 1B is concretely explained hereunder.

In the peripheral circuit region 1B, the semiconductor device has an active region AR2 and an element isolation region IR2. The element isolation region IR2 is used for isolating an element and an element isolation film 2 is formed in the element isolation region IR2. The active region AR2 is specified, namely partitioned, by the element isolation region IR2 and is electrically isolated from another active region by the element isolation region IR2 and a p-type well PW2 is formed in the active region AR2. That is, the active region AR2 is a region where the p-type well PW2 is formed. The p-type well PW2 has the conductive type of the p-type.

Here, as stated earlier, in the sectional view of FIG. 1, the peripheral circuit region 1B is shown adjacently to the memory cell region 1A in order to make the drawing easy to understand. In the sectional view of FIG. 1 therefore, the case where the element isolation region IR1 for the memory cell region 1A is also the element isolation region IR2 for the peripheral circuit region 1B is shown.

As shown in FIG. 1, a MISFET Q1 is formed in the p-type well PW2 in the peripheral circuit region 1B. A plurality of MISFETs Q1 are formed in an actual peripheral circuit region 1B but one of the MISFETs Q1 in a cross section vertical to the gate width direction is shown in FIG. 1.

As shown in FIG. 1, the MISFET Q1 has a semiconductor region comprising an n⁻-type semiconductor region 11c and an n⁺-type semiconductor region 12c, a gate insulating film GI1 formed over the p-type well PW2, and a gate electrode GE1 formed over the gate insulating film GI1. The n⁻-type semiconductor region 11c and the n⁺-type semiconductor region 12c are formed at the upper layer part of the p-type well PW2 in the semiconductor substrate 1. The n⁻-type semiconductor region 11c and the n⁺-type semiconductor region 12c have the conductive type of the n-type that is opposite to the p-type.

The gate insulating film GI1 comprises an insulating film 3. The gate insulating film GI1 functions as the gate insulating film of the MISFET Q1. As the insulating film 3, the insulating film formed as the same layer as the insulating film 3 in the memory cell MC1 can be used.

The gate electrode GE1 comprises a conductive film 4. As the conductive film 4, the conductive film formed as the same layer as the conductive film 4 in the memory cell MC1 can be used.

The semiconductor region comprising the n⁻-type semiconductor region 11c and the n⁺-type semiconductor region 12c is a semiconductor region for a source and a drain into which impurities of the n-type are introduced and has an LDD structure in the same manner as the semiconductor regions MS and MD in the memory cell MC1. That is, the n⁺-type semiconductor region 12c has a junction depth deeper and an impurity concentration higher than the n⁻-type semiconductor region 11c.

Sidewall spacers SW comprising an insulating film such as a silicon oxide film, a silicon nitride film, or a laminated film of those are formed over the sidewalls of the gate electrode GE1.

A metal silicide layer 13 is formed over the n⁺-type semiconductor region 12c, namely over the top surface of the n⁺-type semiconductor region 12c, by a Salicide technology or the like in the same manner as the n⁺-type semiconductor region 12a or the n⁺-type semiconductor region 12b in the memory cell MC1. Here, the metal silicide layer 13 may also be formed over the gate electrode GE1.

The configuration over the memory cell MC1 formed in the memory cell region 1A and over the MOSFET Q1 formed in the peripheral circuit region 1B is concretely explained hereunder.

An insulating film 14 is formed over the semiconductor substrate 1 so as to cover the cap insulating film CP2, the gate insulating film GIm, the memory gate electrode MG, the gate electrode GE1, and the sidewall spacers SW. The insulating film 14 comprises a silicon nitride film or the like for example.

An interlayer insulating film 15 is formed over the insulating film 14. The interlayer insulating film 15 comprises a monolithic silicon oxide film, a laminated film of a silicon nitride film and a silicon oxide film, or the like. The top surface of the interlayer insulating film 15 is flattened.

Contact holes CNT are formed in the interlayer insulating film 15 and conductive plugs PG as conductor sections are embedded into the contact holes CNT.

Each of the plugs PG comprises a thin barrier conductive film formed at the bottom and over the sidewall, namely over the side surface, of the relevant contact hole CNT and a principal conductive film formed over the barrier conductive film so as to fill the relevant contact hole CNT. In FIG. 1, the barrier conductive film and the principal conductive film to configure each of the plugs PG are shown integrally in order to simplify the drawing. Here, the barrier conductive film configuring the plugs PG can comprise a titanium (Ti) film, a titanium nitride (TiN) film, a laminated film of those, or the like for example and the principal conductive film configuring the plugs PG can comprise a tungsten (W) film.

The contact holes CNT and the plugs PG embedded into them are formed over the n$^+$-type semiconductor regions 12$a$, 12$b$, and 12$c$, over the control gate electrode CG, over the memory gate electrode MG, over the gate electrode GE1, and over others. At the bottoms of the contact holes CNT, parts of the metal silicide layer 13 over the surfaces of the n$^+$-type semiconductor regions 12$a$, 12$b$, and 12$c$, a part of the metal silicide layer 13 over the surface of the control gate electrode CG, and a part of the metal silicide layer 13 over the surface of the memory gate electrode MG are exposed for example. Otherwise, at the bottom of a contact hole CNT, a part of the metal silicide layer 13 over the surface of the gate electrode GE1 or the like is exposed for example. Then the plugs PG are coupled to the exposed parts. Here in FIG. 1, the situation where parts of the metal silicide layer 13 over the surfaces of the n$^+$-type semiconductor regions 12$b$ and 12$c$ are exposed at the bottoms of the contact holes CNT and are electrically coupled to the plugs PG filling the contact holes CNT is shown cross-sectionally.

A first-layered wire is formed as a damascene interconnect for an embedded wire using copper (Cu) as the main conductive material for example and an upper-layered wire is also formed as a damascene interconnect over the first-layered wire over the interlayer insulating film 15 into which the plugs PG are embedded but they are not shown in the figure and not explained here. Further, the first-layered wire and the upper-layered wire are not limited to the damascene interconnects, can also be formed by patterning conductive films for wiring, and can be tungsten (W) wires, aluminum (Al) wires, or the like for example.

The operations of the memory cell MC1 formed in the memory cell region 1A are explained hereunder. FIG. 3 is a table showing an example of conditions for applying voltages to sections of a memory cell at the time of "write", "erasure", and "readout".

In the table shown in FIG. 3, a voltage Vmg applied to the memory gate electrode MG, a voltage Vs applied to the semiconductor region MS, a voltage Vcg applied to the control gate electrode CG, and a voltage Vd applied to the semiconductor region MD are described at the time of "write", "erasure", and "readout" respectively. Further, in the table shown in FIG. 3, a voltage Vb applied to the p-type well PW1 is also described at the time of "write", "erasure", and "readout" respectively. Here, the conditions for applying voltages shown in FIG. 3 are merely preferable examples and they are not limited to the conditions and can be changed variously as necessary.

In Embodiment 1, the injection of electrons into the silicon nitride film 8$b$ that is the charge accumulation section in the insulating film 8 of the memory transistor is defined as "write" and the injection of holes, namely positive holes, is defined as "erasure". Further, the power-supply voltage Vdd is set at 1.5 V.

As the write system, hot electron write that is called a source side injection (SSI) system can be used. For example, the voltages shown in the row of "write" in FIG. 3 are applied to the respective sections of the memory cell MC1 to carry out "write" and electrons are injected in the silicon nitride film 8$b$ in the gate insulating film GIm of the memory cell MC1. The hot electrons: are generated mainly in the channel region of the part located under the memory gate electrode MG with the gate insulating film GIm interposed, namely in the semiconductor region MV; and are injected into the silicon nitride film 8$b$ that is the charge accumulation section in the gate insulating film GIm. The injected hot electrons are trapped in a trap level in the silicon nitride film 8$b$ in the gate insulating film GIm and resultantly the threshold voltage (Vth) of the memory transistor rises.

As the erasure system, a hot hole injection erasure system based on a band-to-band tunneling (BTBT) phenomenon can be used. That is, erasure is carried out by injecting holes, namely positive holes, generated by the BTBT phenomenon into the charge accumulation section, namely the silicon nitride film 8$b$ in the gate insulating film GIm. For example, the threshold voltage of the memory transistor is lowered by applying the voltages shown in the row of "erasure" in FIG. 3 to the respective sections of the memory cell MC1 to carry out erasure, generating holes by the BTBT phenomenon and applying electric field acceleration, and thereby injecting the holes into the silicon nitride film 8$b$ in the gate insulating film GIm of the memory cell MC1.

As the erasure system, an erasure system by hole injection using a direct tunneling phenomenon can also be used. That is, erasure is carried out by injecting holes into the charge accumulation section, namely the silicon nitride film 8$b$ in the gate insulating film GIm, by the direct tunneling phenomenon. Although they are not shown in the row of "erasure" in FIG. 3, the voltage Vmg applied to the memory gate electrode MG is set at 12 V that is a positive voltage for example and the voltage Vb applied to the p-type well PW1 is set at 0 V for example. As a result, holes are injected from the side of the memory gate electrode MG into the charge accumulation section, namely the silicon nitride film 8$b$, through the silicon oxide film 8$c$ by the direct tunneling phenomenon and offset the electrons in the silicon nitride film 8$b$ and thus the erasure is carried out. Otherwise, holes injected into the silicon nitride film 8$b$ are trapped by the trap level in the silicon nitride film 8$b$ and thus erasure is carried out. As a result, the threshold voltage of the memory transistor lowers and an erased state is caused. By using such an erasure system, it is possible to reduce a consumption current in comparison with the case of using the erasure system by the BTBT phenomenon.

At the time of readout, such voltages as shown in the row of "readout" in FIG. 3 are applied to the respective sections in the memory cell MC1 where readout is carried out for example. By setting the voltage Vmg applied to the memory gate electrode MG at the time of readout at a value between a threshold voltage of the memory transistor in a write state and a threshold voltage of the memory transistor in an erased state, the write state or the erased state can be distinguished.

<Manufacturing Method of Semiconductor Device>

A manufacturing method of a semiconductor device according to Embodiment 1 is explained hereunder.

Figure 4:
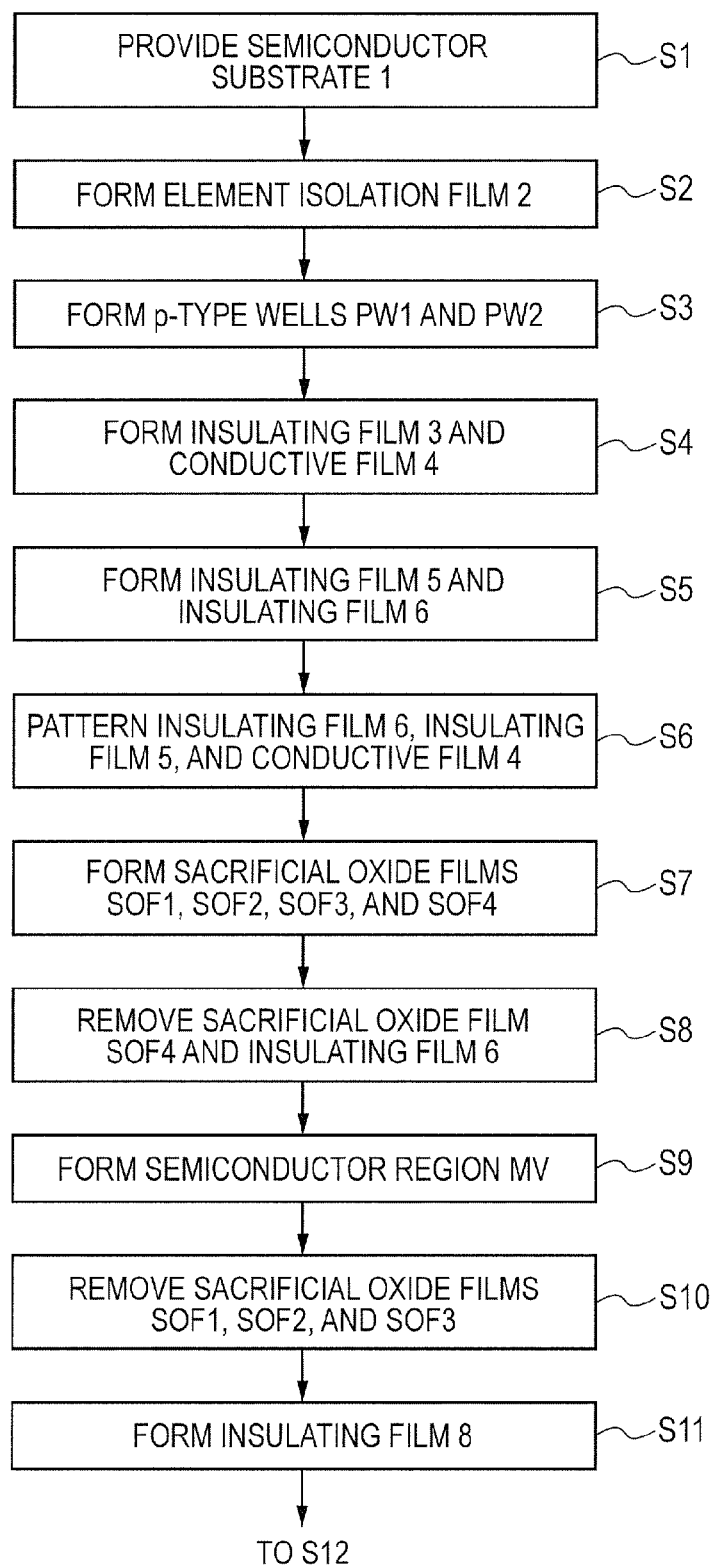
FIG. 4 is a process flow diagram showing a part of a manufacturing step of a semiconductor device according to Embodiment 1.
Figure 5:
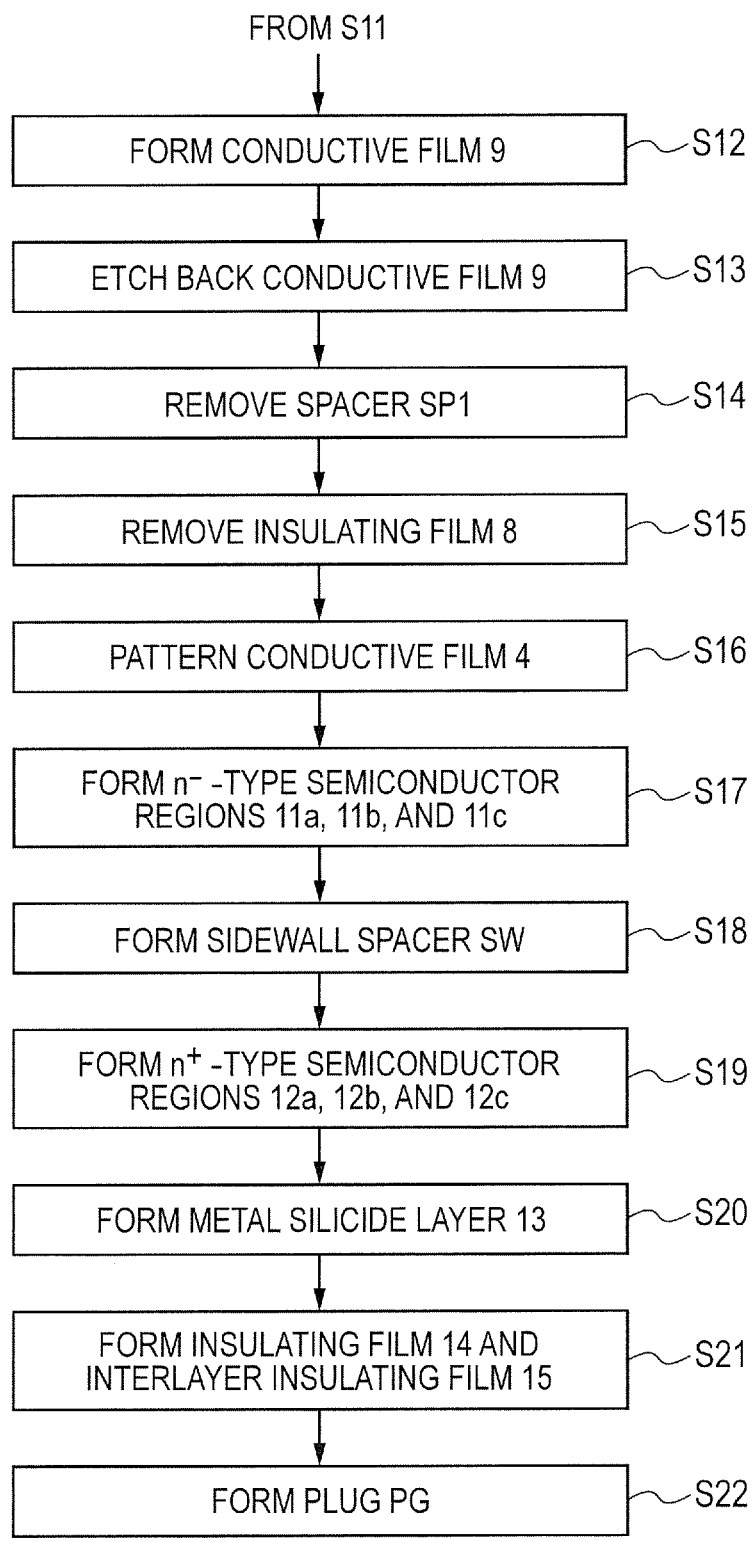
FIG. 5 is a process flow diagram showing a part of the manufacturing step of the semiconductor device according to Embodiment 1.
Figure 6:
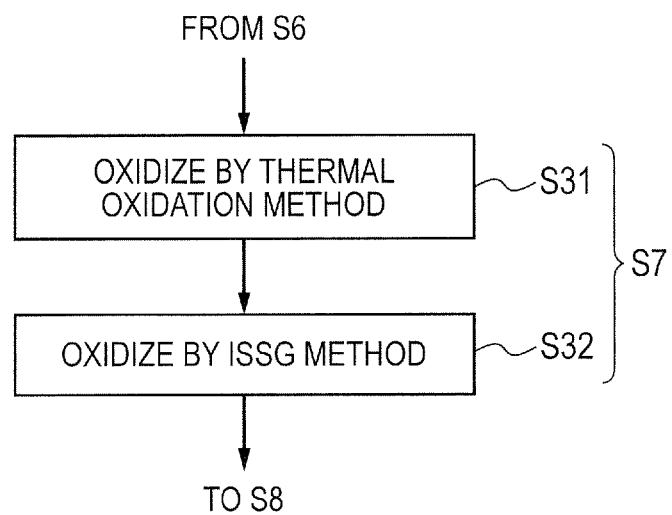
FIG. 6 is a process flow diagram showing a part of the manufacturing step of the semiconductor device according to Embodiment 1.

FIGS. 4 to 6 are process flow diagrams showing parts of a manufacturing step of a semiconductor device according to Embodiment 1. FIGS. 7 to 28 are sectional views showing a substantial part during manufacturing steps of a semiconductor device according to Embodiment 1. FIG. 6 shows a step included in Step 7 of FIG. 4. In the sectional views shown in FIGS. 7 to 28, the sectional views of the substantial parts in a memory cell region 1A and a peripheral circuit region 1B are shown and the state of forming a memory cell MC1 in the memory cell region 1A and a MISFET Q1 in the peripheral circuit region 1B, respectively, is shown.

As stated earlier, the memory cell region 1A and the peripheral circuit region 1B may not be adjacent to each other but, for making the drawings easy to understand, the peripheral circuit region 1B is shown adjacently to the memory cell region 1A in the sectional views of FIGS. 7 to 28.

Although, in Embodiment 1, explanations are made on the basis of the case of forming a control transistor CT and a memory transistor MT, those being the n-channel type, in a memory cell region 1A, it is also possible to form a control transistor CT and a memory transistor MT, those being the p-channel type, by reversing the conductive type, in a memory cell region 1A. Likewise, although, in Embodiment 1, explanations are made on the basis of the case of forming a MISFET Q1 of the n-channel type in a peripheral circuit region 1B, it is also possible to form a MISFET Q1 of the p-channel type by reversing the conductive type in a peripheral circuit region 1B. Further, it is also possible to form a CMISFET (Complementary MISFET) and the like in a peripheral circuit region 1B.

Figure 7:
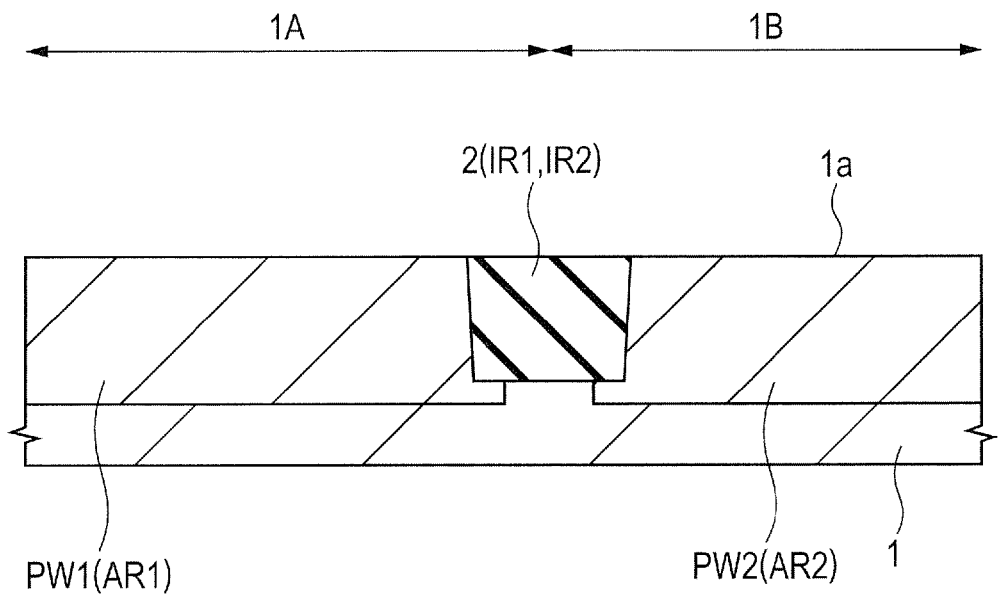
FIG. 7 is a sectional view showing a substantial part during a manufacturing step of a semiconductor device according to Embodiment 1.

As shown in FIG. 7, firstly a semiconductor substrate 1 as a semiconductor wafer comprising p-type monocrystal silicon having a resistivity of about 1 to 10 Ωcm or the like for example is arranged, namely provided (Step S1 in FIG. 4).

Successively, as shown in FIG. 7, an element isolation film 2 that acts as an element isolation region IR1 to partition an active region AR1 in a memory cell region 1A over a main surface 1a of the semiconductor substrate 1 and acts as an element isolation region IR2 to partition an active region AR2 in a peripheral circuit region 1B over the main surface 1a of the semiconductor substrate 1 is formed (Step S2 in FIG. 4). The element isolation film 2 comprises an insulator such as a silicon oxide and can be formed by an STI (Shallow Trench Isolation) method, a LOCOS (Local Oxidization of Silicon) method, or the like for example. For example, it is possible to form the element isolation film 2 by forming trenches for element isolation in the element isolation regions IR1 and IR2 and thereafter embedding an insulating film comprising silicon oxide for example into the trenches for element isolation.

Successively, as shown in FIG. 7, a p-type well PW1 is formed in the active region AR1 in the memory cell region 1A and a p-type well PW2 is formed in the active region AR2 in the peripheral circuit region 1B (Step S3 in FIG. 4). The p-type wells PW1 and PW2 can be formed by introducing impurities of the p-type such as boron (B) into the semiconductor substrate 1 by an ion implantation method or the like for example. The p-type wells PW1 and PW2 are formed from the main surface 1a of the semiconductor substrate 1 to a prescribed depth. That is, by applying Steps S1 to S3, the semiconductor substrate 1 having the p-type well PW1 formed over the main surface 1a in the memory cell region 1A is provided.

Successively, the surface of the semiconductor substrate 1 is cleaned by removing a natural oxide film over the surface of the semiconductor substrate 1 by wet etching using a hydrogen fluoride (HF) aqueous solution or the like and washing the surface of the semiconductor substrate 1 for example. As a result, the surface of the semiconductor substrate 1, namely the surfaces of the p-type wells PW1 and PW2, is exposed.

Figure 8:
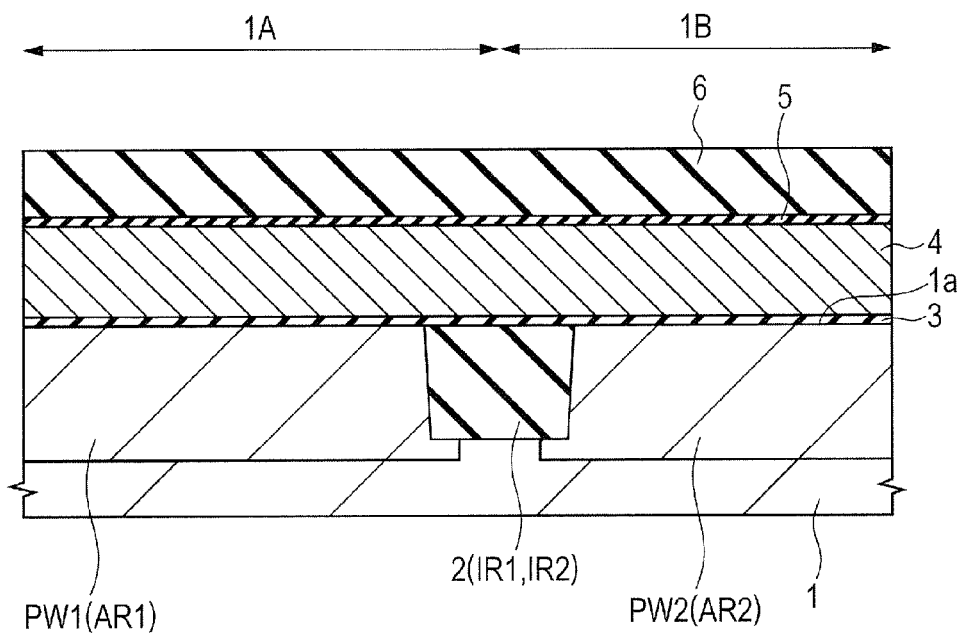
FIG. 8 is a sectional view showing a substantial part during a manufacturing step of the semiconductor device according to Embodiment 1.

Successively, as shown in FIG. 8, an insulating film 3 and a conductive film 4 are formed over the whole main surface 1a of the semiconductor substrate 1 (Step S4 in FIG. 4).

At Step S4, firstly as shown in FIG. 8, the insulating film 3 is formed over the main surface 1a of the semiconductor substrate 1 in the memory cell region 1A and the peripheral circuit region 1B. As stated earlier, as the insulating film 3, a silicon oxide film, a silicon nitride film, a silicon oxynitride film, or a High-k film, namely a high permittivity film, can be used and the examples of the materials usable as the insulating film 3 are as stated earlier. Further, the insulating film 3 can be formed by a thermal oxidation method, a sputtering method, an atomic layer deposition (ALD) method, a chemical vapor deposition (CVD) method, or the like.

At Step S4, successively as shown in FIG. 8, the conductive film 4 comprising silicon is formed over the insulating film 3 in the memory cell region 1A and the peripheral circuit region 1B.

Preferably, the conductive film 4 comprises a polycrystal silicon film, namely a polysilicon film. The conductive film 4 can be formed by a CVD method or the like. The film thickness of the conductive film 4 can be about a thickness sufficient to cover the insulating film 3. Further, it is also possible to: form the conductive film 4 as an amorphous silicon film on the occasion of film forming; and then convert the amorphous silicon film to a polycrystal silicon film through a succeeding heat treatment.

As the conductive film 4, a substance having a low resistivity by introducing impurities of the n-type such as phosphorus (P) or arsenic (As) or impurities of the p-type such as boron (B) is preferably used for example. The impurities can be introduced during or after the forming of the conductive film 4. When the impurities are introduced during the forming of the conductive film 4, it is possible to form the conductive film 4 into which the impurities are introduced by mixing a doping gas to a gas for forming the conductive film 4. When the impurities are introduced after the forming of a silicon film in contrast, it is possible to form the conductive film 4 into which the impurities are introduced by introducing the impurities into the silicon film by an ion implantation method or the like after the silicon film is formed with the impurities not introduced intentionally.

Successively, as shown in FIG. 8, an insulating film 5 and an insulating film 6 are formed over the whole main surface 1a of the semiconductor substrate 1, namely over the conductive film 4 (Step S5 in FIG. 4).

At Step S5, firstly as shown in FIG. 8, the insulating film 5 containing silicon and oxygen is formed over the conductive film 4 in the memory cell region 1A and the peripheral circuit region 1B. The insulating film 5 comes to be a cap insulating film CP1 (refer to FIG. 9 described later).

It is possible to form the insulating film 5 comprising a silicon oxide film having a thickness of about 6 nm for example by thermally oxidizing the surface of the conductive film 4 comprising a silicon film for example. Further, it is also possible to form the insulating film 5 comprising a silicon oxide film by a CVD method instead of thermally oxidizing the surface of the conductive film 4 comprising a silicon film.

Further, with regard to the material of the insulating film 5, an insulating film comprising another material can be used instead of the silicon oxide film. Otherwise, it is also possible to form the insulating film 6 directly over the conductive film 4 without forming the insulating film 5.

At Step S5, successively as shown in FIG. 8, the insulating film 6 containing silicon and nitrogen is formed over the insulating film 5 in the memory cell region 1A and the peripheral circuit region 1B. It is possible to form the insulating film 6 comprising a silicon nitride film by a CVD method or the like for example.

Figure 9:
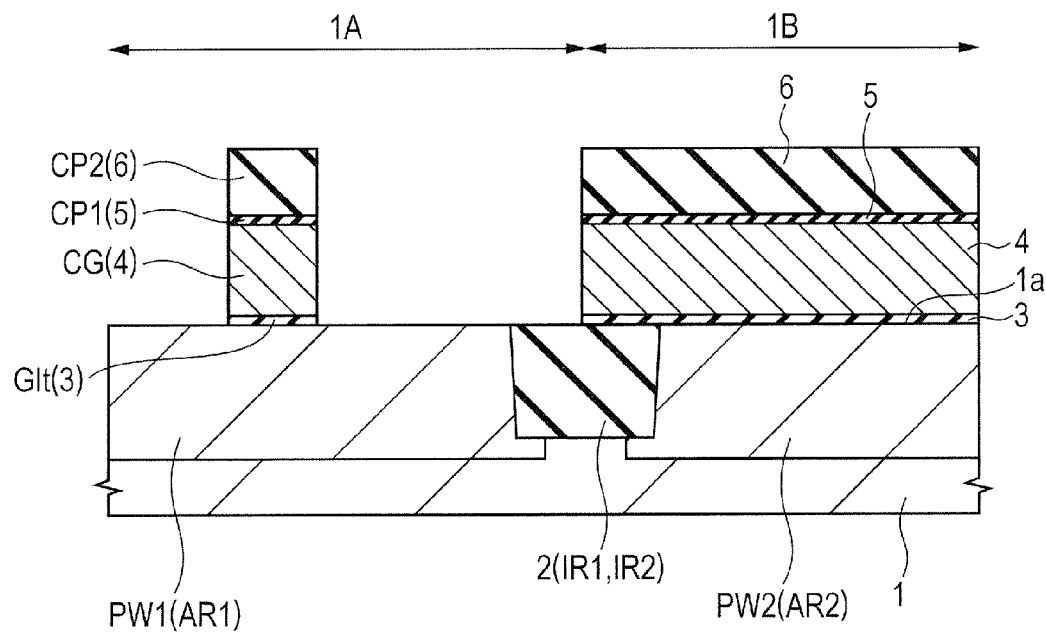
FIG. 9 is a sectional view showing a substantial part during a manufacturing step of the semiconductor device according to Embodiment 1.

Successively, as shown in FIG. 9, the insulating film 6, the insulating film 5, and the conductive film 4 are patterned (Step S6 in FIG. 4). At Step S6, the insulating film 6, the insulating film 5, and the conductive film 4 are patterned by photolithography and etching for example.

Firstly, a resist film is formed over the insulating film 6. Successively, in the memory cell region 1A, openings penetrating the resist film and reaching the insulating film 6 are formed in the regions other than a region in which a control gate electrode CG is to be formed and a resist pattern comprising the resist film in which the openings are formed is formed. On this occasion, the part, which is arranged in the region in which the control gate electrode CG is to be formed, of the insulating film 6 in the memory cell region 1A and the part, which is arranged in the peripheral circuit region 1B, of the insulating film 6 are covered with the resist film.

Successively, the insulating film 6, the insulating film 5, and the conductive film 4 are etched and patterned by dry etching or the like for example with the resist pattern used as an etching mask. As a result, in the memory cell region 1A, a control gate electrode CG comprising the conductive film 4 is formed and a gate insulating film GIt comprising the insulating film 3 between the control gate electrode CG and the p-type well PW1 in the semiconductor substrate 1 is formed. That is, the control gate electrode CG is formed over the p-type well PW1 in the semiconductor substrate 1 with the gate insulating film GIt interposed in the memory cell region 1A.

Further, a cap insulating film CP1 comprising the part, which is formed over the control gate electrode CG, of the insulating film 5 is formed and a cap insulating film CP2 comprising the part, which is formed over the control gate electrode CG with the cap insulating film CP1 interposed, of the insulating film 6 is formed. Meanwhile, in the peripheral circuit region 1B, the insulating film 6, the insulating film 5, and the conductive film 4 remain. Successively, the resist pattern, namely the resist film, is removed.

Here, in the memory cell region 1A, the part, which is not covered with the control gate electrode CG, of the insulating film 3 can be removed by applying dry etching of Step S6 or by applying wet etching after the dry etching of Step S6. Then in the memory cell region 1A, at the parts where the control gate electrode CG is not formed, the p-type well PW1 in the semiconductor substrate 1 is exposed.

Figure 10:
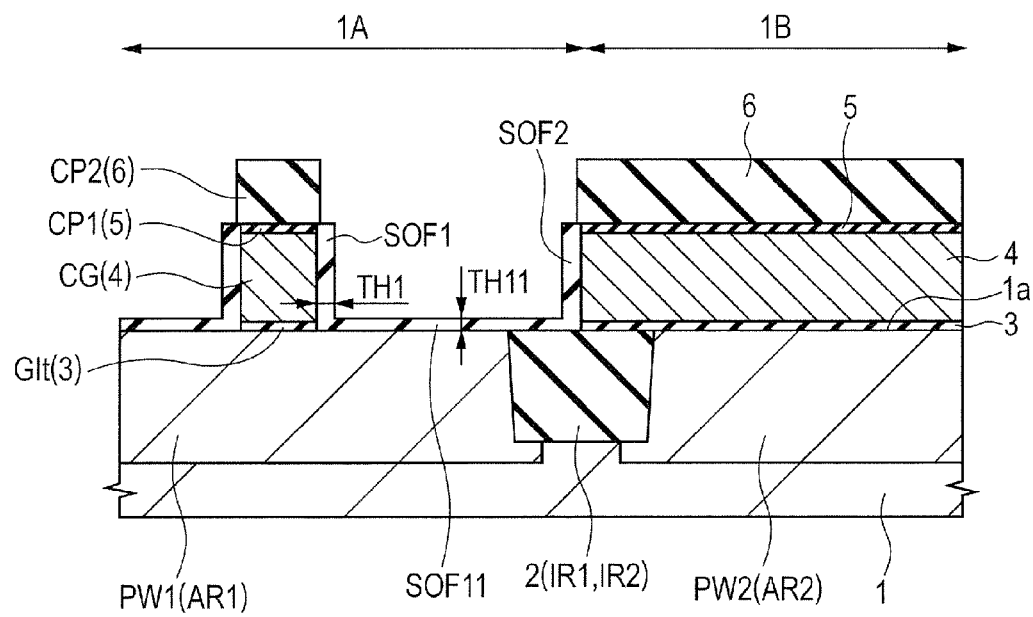
FIG. 10 is a sectional view showing a substantial part during a manufacturing step of the semiconductor device according to Embodiment 1.
Figure 11:
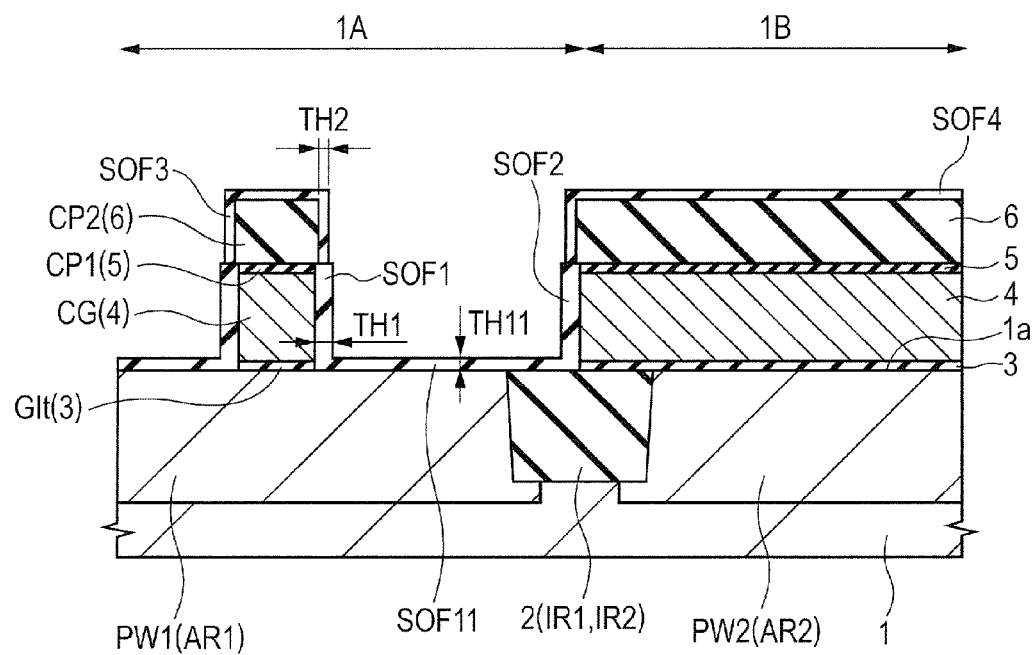
FIG. 11 is a sectional view showing a substantial part during a manufacturing step of the semiconductor device according to Embodiment 1.

Successively, as shown in FIGS. 10 and 11, sacrificial oxide films SOF1, SOF2, SOF3, and SOF4 are formed (Step S7 in FIG. 4). At Step S7, the side surfaces of the control gate electrode CG and the side surface of the part, which remains in the peripheral circuit region 1B, of the conductive film 4 are oxidized and the sacrificial oxide films SOF1 and SOF2 are formed over the side surfaces of the control gate electrode CG and the side surface of the part, which remains in the peripheral circuit region 1B, of the conductive film 4. Further, at Step S7, the surface of the cap insulating film CP2 and the surface of the part, which remains in the peripheral circuit region 1B, of the insulating film 6 are oxidized and the sacrificial oxide films SOF3 and SOF4 are formed over the surface of the cap insulating film CP2 and the surface of the part, which remains in the peripheral circuit region 1B, of the insulating film 6.

Step S7 includes a step of oxidizing by a thermal oxidation method (Step S31 in FIG. 6) and a step of oxidizing by an ISSG (In Situ Steam Generation) method (Step S32 in FIG. 6). That is, in Embodiment 1, the thermal oxidation method and the ISSG oxidation method are used jointly when the sacrificial oxide films SOF1, SOF2, SOF3, and SOF4 are formed. Further, in Embodiment 1, after oxidation is applied by the thermal oxidation method at Step S31, oxidation is applied by the ISSG oxidation method at Step S32.

Even in the case of damaging the side surfaces of the control gate electrode CG by etching at Step S6, the damaged part is oxidized by forming the sacrificial oxide film SOF1 and hence the added damage can be removed at Step S7.

Preferably at Step S7, a sacrificial oxide film SOF11 is formed over the main surface 1a of the semiconductor substrate 1. That is, at Step S7, in plan view, the sacrificial oxide film SOF11 is formed at least over the part, which is located on the first side of the control gate electrode CG, namely on the side where a memory gate electrode MG (refer to FIG. 21 described later) adjacent to the control gate electrode CG is arranged, of the p-type well PW1.

As a result, even when the main surface 1a of the semiconductor substrate 1 is damaged by etching at Step S6, the damaged part is oxidized by forming the sacrificial oxide film SOF11 and hence the added damage can be removed at Step S7. In other words, even when at least the surface of the part, which is located on the first side of the control gate electrode CG, of the p-type well PW1 is damaged by etching at Step S6, the damaged part is oxidized by forming the sacrificial oxide film SOF11 and hence the added damage can be removed at Step S7.

Further, by forming the sacrificial oxide film SOF11, at Step S9 that will be described later, it is possible to prevent the top surface of the p-type well PW1 and the side surfaces of the control gate electrode CG from being damaged when a semiconductor region MV of the n-type is formed at the upper layer part of the p-type well PW1.

The thermal oxidation method is a method of forming an oxide film comprising a silicon oxide film or the like over the surface of a semiconductor substrate by heating the semiconductor substrate comprising silicon or the like to a temperature of 800° C. to 1,100° C. for example and applying heat treatment. As the thermal oxidation method, a dry oxidation method or a wet oxidation method can be used for example. The dry oxidation method is a method of applying heat treatment in an oxygen gas and the wet oxidation method is a method of applying heat treatment in a gas formed by adding deionized water vapor to an oxygen gas.

Meanwhile, the ISSG (In Situ Steam Generation) method is a method of forming an oxide film comprising a silicon oxide film or the like over the surface of a semiconductor substrate by directly introducing hydrogen and oxygen into a depressurized heat treatment chamber and applying radical oxidation reaction over the surface of the semiconductor substrate comprising silicon or the like heated to a temperature of 800° C. to 1,100° C. for example.

In Embodiment 1, firstly as shown in FIG. 10, oxidation is applied by the thermal oxidation method (Step S31 in FIG. 6).

By the thermal oxidation method, the surface of the conductive film 4 comprising a silicon film is likely to be oxidized for example. As a result, at Step S31, the side surfaces of the control gate electrode CG comprising the conductive film 4 are oxidized and the sacrificial oxide film SOF1 is formed over the side surfaces of the control gate electrode CG. Further, at Step S31, the side surface of the part, which remains in the peripheral circuit region 1B, of the conductive film 4 is oxidized and the sacrificial oxide film SOF2 is formed over the side surface of the part, which remains in the peripheral circuit region 1B, of the conductive film 4.

That is, at Step S31, the side surfaces of the control gate electrode CG and the side surface of the part, which remains in the peripheral circuit region 1B, of the conductive film 4 are oxidized by the thermal oxidation method.

Meanwhile, by the thermal oxidation method, the surface of the insulating film 6 comprising a silicon nitride film is hardly oxidized for example. Consequently, at Step S31, a sacrificial oxide film is not formed over the surface of the cap insulating film CP2 comprising the insulating film 6 and the surface of the part, which remains in the peripheral circuit region 1B, of the insulating film 6.

Here, at Step S31, in the memory cell region 1A, the top surface of the p-type well PW1 is also oxidized and the sacrificial oxide film SOF11 is also formed over the top surface of the p-type well PW1.

For example, the surface of the conductive film 4 is likely to be oxidized by introducing impurities of the n-type into the conductive film 4 and the like and hence the surface of the p-type well PW1 is hardly oxidized in comparison with the surface of the conductive film 4. As a result, in the memory cell region 1A, the film thickness TH11 of the sacrificial oxide film SOF11 formed over the top surface of the p-type well PW1 in the semiconductor substrate 1 is smaller than the film thickness TH1 of the sacrificial oxide film SOF1 formed over the side surfaces of the control gate electrode CG comprising the conductive film 4.

At Step S31, oxidation can be applied at a temperature of about 950° C. by the thermal oxidation method for example. On this occasion, it is possible to: set the film thickness TH1 of the sacrificial oxide film SOF1 at about 5 nm for example; and set the film thickness TH11 of the sacrificial oxide film SOF11 at about 3 nm for example. Further, it is possible to set the film thickness of the sacrificial oxide film SOF2 at a film thickness comparable to the film thickness of the sacrificial oxide film SOF1.

Successively, as shown in FIG. 11, oxidation is applied by the ISSG oxidation method (Step S32 in FIG. 6).

By the ISSG oxidation method, since radical oxidation reaction is applied, the surface of the conductive film 4 comprising a silicon film is oxidized for example. Consequently, at Step S32, the side surfaces of the control gate electrode CG comprising the conductive film 4 are oxidized further and the film thickness TH1 of the sacrificial oxide film SOF1 formed over the side surfaces of the control gate electrode CG increases. Further, at Step S32, the side surface of the part, which remains in the peripheral circuit region 1B, of the conductive film 4 is oxidized further and the film thickness of the sacrificial oxide film SOF2 formed over the side surface of the part, which remains in the peripheral circuit region 1B, of the conductive film 4 increases.

Meanwhile, by the ISSG oxidation method, it is possible to oxide also the surface of the insulating film 6 comprising a silicon nitride film for example because the radical oxidation reaction is applied. Consequently, at Step S32, the surface of the cap insulating film CP2 comprising the insulating film 6 is oxidized and the sacrificial oxide film SOF3 is formed over the surface of the cap insulating film CP2. Further, at Step S32, the surface of the part, which remains in the peripheral circuit region 1B, of the insulating film 6 is oxidized and the sacrificial oxide film SOF4 is formed over the surface of the part, which remains in the peripheral circuit region 1B, of the insulating film 6.

That is, at Step S32, the side surfaces of the control gate electrode CG, the side surface of the part, which remains in the peripheral circuit region 1B, of the conductive film 4, the surface of the cap insulating film CP2, and the surface of the part, which remains in the peripheral circuit region 1B, of the insulating film 6 are oxidized by the ISSG oxidation method.

Here, at Step S32, in the memory cell region 1A, the top surface of the p-type well PW1 is also oxidized and the film thickness of the sacrificial oxide film SOF11 formed over the top surface of the p-type well PW1 also increases.

At Step S32, oxidation can be applied at a temperature of about 900° C. by the ISSG oxidation method for example. On this occasion, it is possible to: increase the film thickness TH1 of the sacrificial oxide film SOF1 to about 6 nm for example; increase the film thickness TH11 of the sacrificial oxide film SOF11 to about 4 nm for example; and set the film thickness TH2 of the sacrificial oxide film SOF3 at about 1 nm for example. Further, it is possible to: increase the film thickness of the sacrificial oxide film SOF2 to a film thickness comparable to the film thickness of the sacrificial oxide film SOF1; and set the film thickness of the sacrificial oxide film SOF4 at a film thickness comparable to the film thickness of the sacrificial oxide film SOF3.

In this way, at Step S7, by applying Steps S31 and S32, the side surfaces of the control gate electrode CG, the side surface of the part, which remains in the peripheral circuit region 1B, of the conductive film 4, the surface of the cap insulating film CP2, and the surface of the part, which remains in the peripheral circuit region 1B, of the insulating film 6 are oxidized. Then the sacrificial oxide film SOF1 is formed over the side surfaces of the control gate electrode CG, the sacrificial oxide film SOF2 is formed over the side surface of the part, which remains in the peripheral circuit region 1B, of the conductive film 4, the sacrificial oxide film SOF3 is formed over the surface of the cap insulating film CP2, and the sacrificial oxide film SOF4 is formed over the surface of the part, which remains in the peripheral circuit region 1B, of the insulating film 6.

Successively, as shown in FIGS. 12 to 16, in the peripheral circuit region 1B, the sacrificial oxide film SOF4 and the insulating film 6 are removed (Step S8 in FIG. 4).

Figure 12:
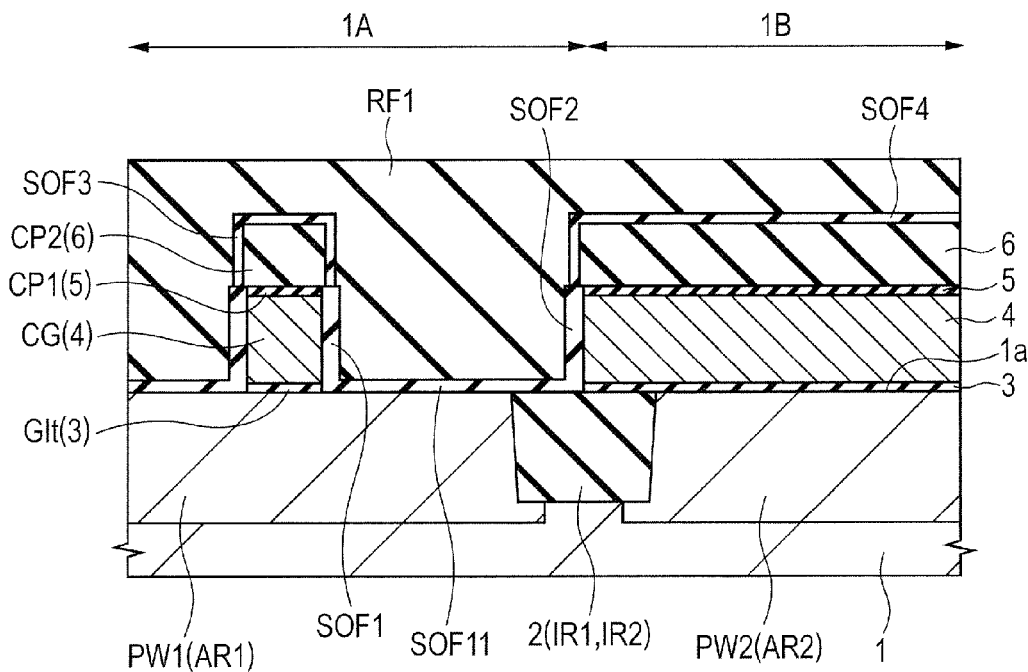
FIG. 12 is a sectional view showing a substantial part during a manufacturing step of the semiconductor device according to Embodiment 1.

At Step S8, firstly as show in FIG. 12, in the memory cell region 1A, a resist film RF1 is formed so as to cover the cap insulating film CP2 over the surface of which the sacrificial oxide film SOF3 is formed and the control gate electrode CG over the side surfaces of which the sacrificial oxide film SOF1 is formed. Further, the resist film RF1 is formed so as to cover the part, which remains in the peripheral circuit region 1B, of the insulating film 6 over the surface of which the sacrificial oxide film SOF4 is formed and the part, which remains in the peripheral circuit region 1B, of the conductive film 4 over the side surface of which the sacrificial oxide film SOF2 is formed.

Figure 13:
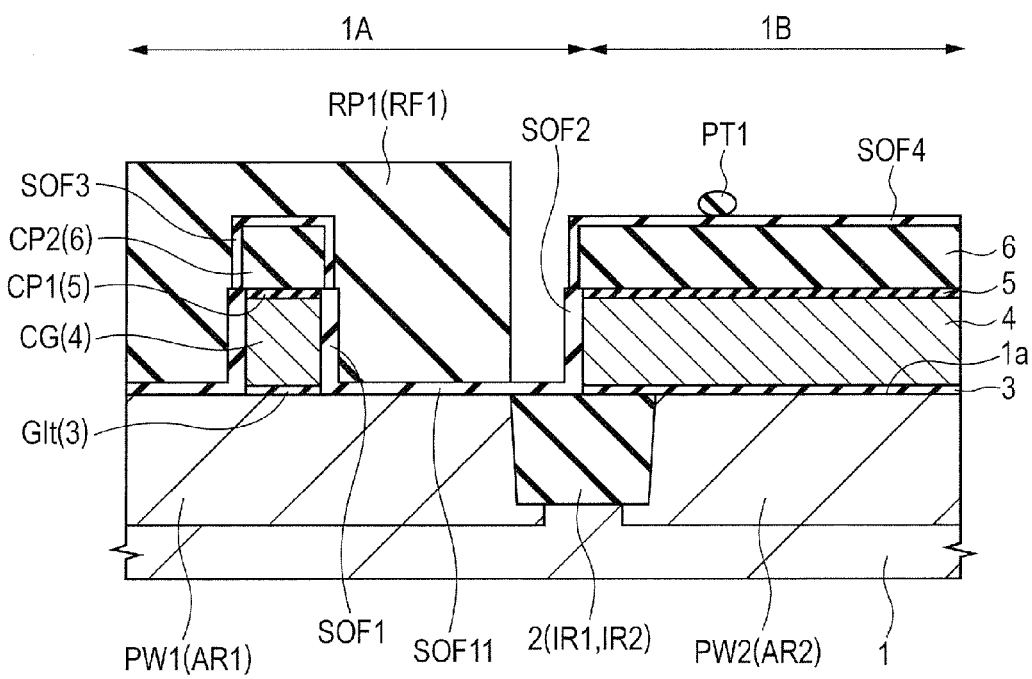
FIG. 13 is a sectional view showing a substantial part during a manufacturing step of the semiconductor device according to Embodiment 1.

Successively, as shown in FIG. 13, the resist film RF1 is patterned by subjecting the resist film RF1 to pattern exposure and thereafter development, the resist film RF1 is removed in the peripheral circuit region 1B, and the resist film RF1 remains in the memory cell region 1A. As a result, a resist pattern RP1 comprising the part, which remains in the memory cell region 1A, of the resist film RF1 is formed.

Figure 14:
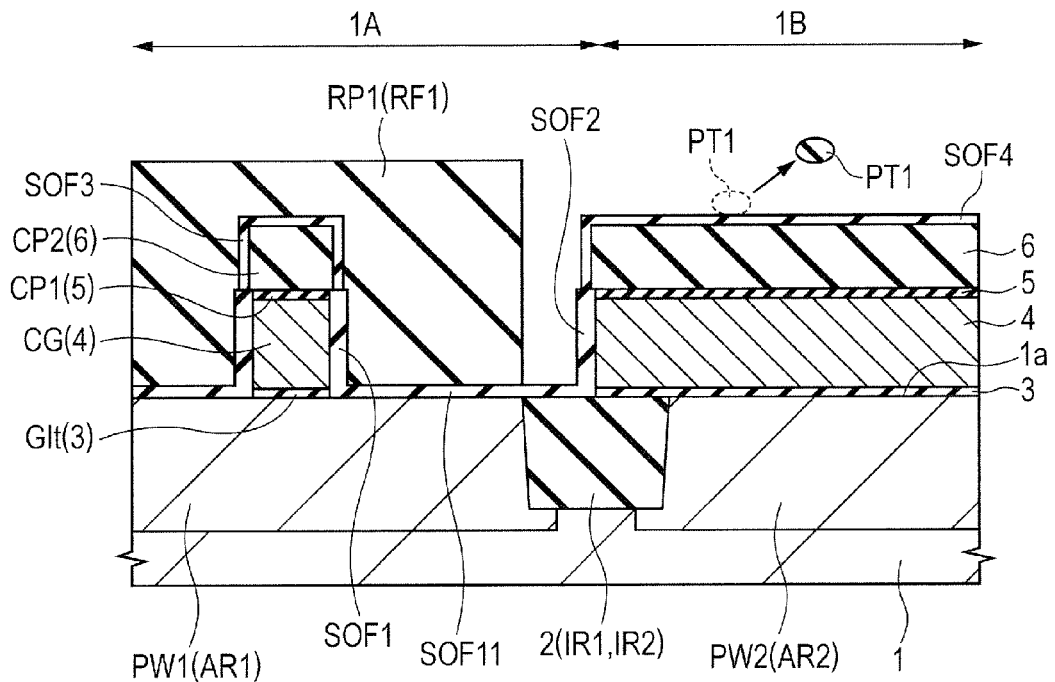
FIG. 14 is a sectional view showing a substantial part during a manufacturing step of the semiconductor device according to Embodiment 1.
Figure 15:
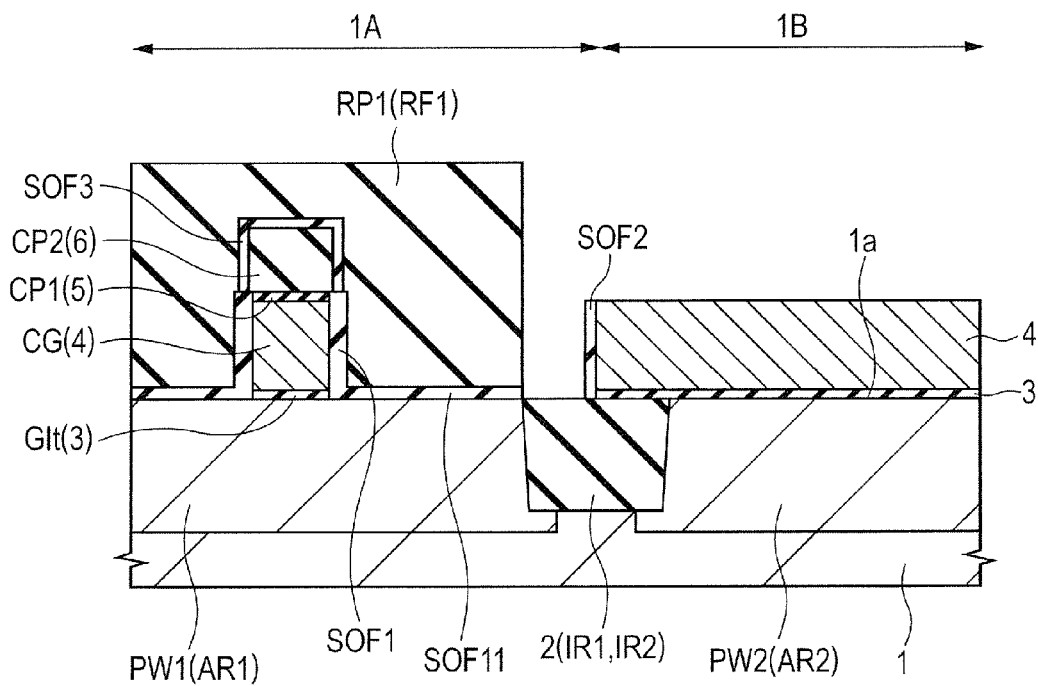
FIG. 15 is a sectional view showing a substantial part during a manufacturing step of the semiconductor device according to Embodiment 1.

Successively, as shown in FIGS. 14 and 15, the part, which remains in the peripheral circuit region 1B, of the insulating film 6 is removed. At the step of removing the insulating film 6, the insulating film 6 is removed by etching such as dry etching or the like for example with the resist pattern RP1 used as an etching mask.

As shown in FIG. 13, when the resist film RF1 is subjected to pattern exposure and thereafter development, it sometimes happens that a particle PT1 is generated as a foreign substance and the generated particle PT1 adheres to the top surface of a part of the sacrificial oxide film SOF4 formed over the insulating film 6 in the peripheral circuit region 1B. The particle PT1 is either a particle comprising an organic substance contained in the resist film RF1 or a particle as a foreign substance contained in a liquid developer used for development for example.

In Embodiment 1 however, the adhesiveness between the particle PT1 adhering to the top surface of the sacrificial oxide film SOF4 and the top surface of the sacrificial oxide film SOF4 is small. Consequently, as shown in FIG. 14, the particle PT1 adhering to the top surface of the sacrificial oxide film SOF4 easily breaks away from the top surface of the sacrificial oxide film SOF4 at the initial stage of the step of etching the insulating film 6. As a result, it is possible to prevent the particle PT1 adhering to the top surface of the sacrificial oxide film SOF4 from becoming an etching mask when the insulating film 6 is etched. Consequently, as shown in FIG. 15, it is possible to completely remove the part, which remains in the peripheral circuit region 1B, of the insulating film 6 at the step of etching the insulating film 6.

Here, as shown in FIG. 15, the film thickness of the insulating film 5 is smaller than the film thickness of the insulating film 6 and hence the part, which remains in the peripheral circuit region 1B, of the insulating film 5 is also removed when the part, which remains in the peripheral circuit region 1B, of the insulating film 6 is removed by etching.

Figure 16:
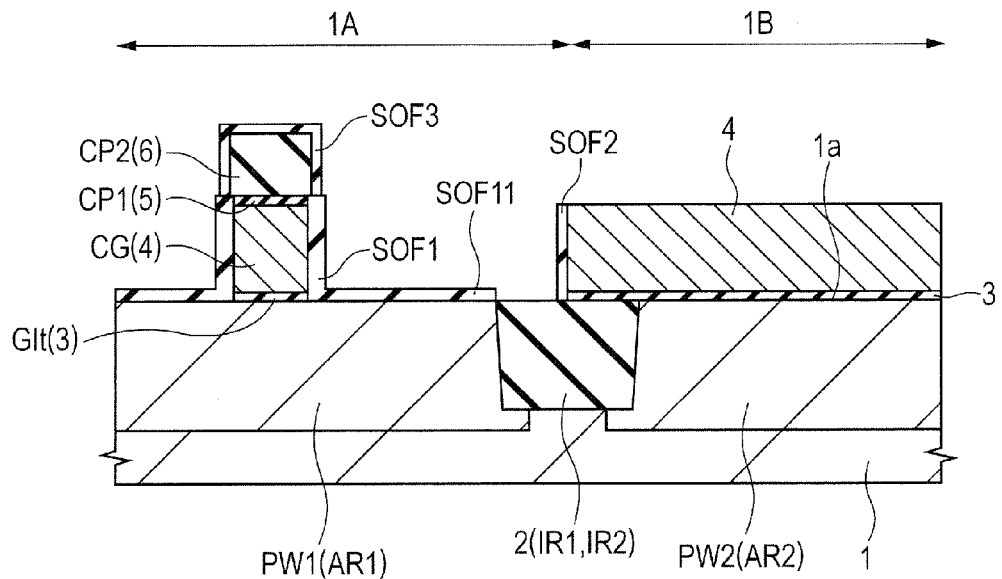
FIG. 16 is a sectional view showing a substantial part during a manufacturing step of the semiconductor device according to Embodiment 1.

Successively, as shown in FIG. 16, the part, which remains in the memory cell region 1A, of the resist film RF1, namely the resist pattern RP1, is removed.

Figure 17:
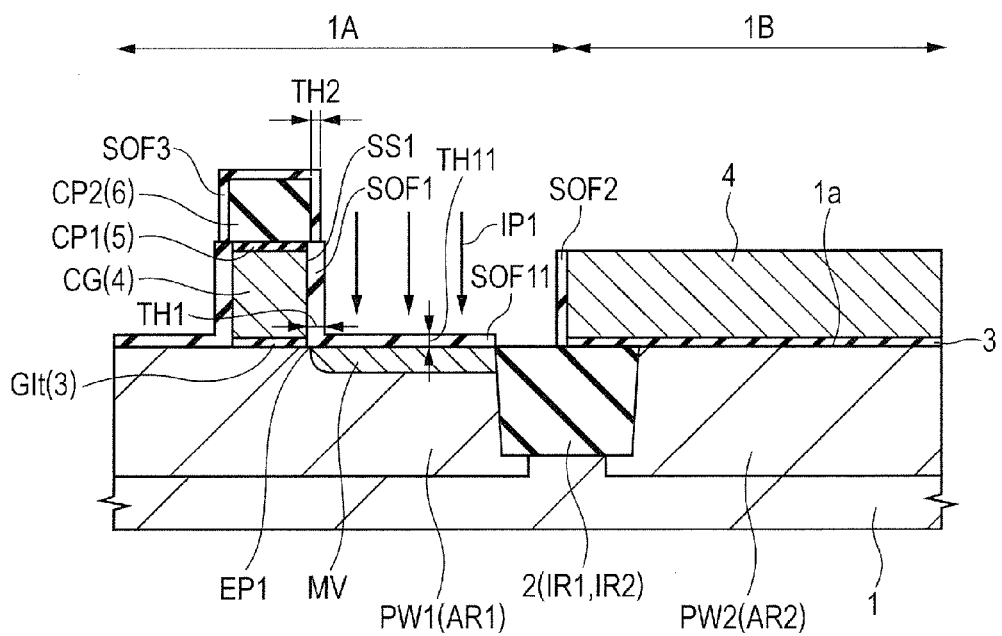
FIG. 17 is a sectional view showing a substantial part during a manufacturing step of the semiconductor device according to Embodiment 1.

Successively, as shown in FIG. 17, a semiconductor region MV is formed (Step S9 in FIG. 4). At Step S9, in the memory cell region 1A, impurities IP1 of the n-type such as phosphorus (P) or arsenic (As) for example are introduced into the p-type well PW1 by an ion implantation method with the cap insulating film CP2 over the surface of which the sacrificial oxide film SOF3 is formed and the control gate electrode CG over the side surfaces of which the sacrificial oxide film SOF1 is formed used as masks. As a result, the semiconductor region MV of the n-type is formed at the upper layer part of the part, which is located on the first side of the control gate electrode CG, of the p-type well PW1 in plan view.

In plan view, a memory gate electrode MG (refer to FIG. 21 described later) is formed at the part, which is located on the first side of the control gate electrode CG, of the p-type well PW1 with a gate insulating film GIm interposed. Consequently, the semiconductor region MV of the n-type is formed at the upper layer part of the part, which is located on the side where the memory gate electrode MG adjacent to the control gate electrode CG is arranged in both the sides of the control gate electrode CG, of the p-type well PW1 in plan view.

At Step S7, in plan view, the sacrificial oxide film SOF11 is formed over the top surface of the part, which is located on the first side of the control gate electrode CG, namely on the side where the memory gate electrode MG (refer to FIG. 21 described later) adjacent to the control gate electrode CG is arranged, of the p-type well PW1. As a result, at Step S9, it is possible to prevent the top surface of the p-type well PW1 from being damaged when the impurities IP1 of the n-type are introduced into the p-type well PW1 by an ion implantation method.

In Embodiment 1 further, the impurities IP1 of the n-type are introduced into the p-type well PW1 by an ion implantation method with the control gate electrode CG on the side surfaces of which the sacrificial oxide film SOF1 is formed used as a mask. As a result, it is possible to form the semiconductor region MV of the n-type so as to be separated from the control gate electrode CG in plan view. That is, an end EP1 that is the end of the semiconductor region MV of the n-type on the center side of the control gate electrode CG is arranged on the side, the side being opposite to the center side of the control gate electrode CG, compared with a side surface SS1 of the control gate electrode CG on the side of the memory gate electrode MG (refer to FIG. 21 described later) in plan view.

Further, although explanations have been made on the basis of the example of forming the semiconductor region MV of the n-type at the upper layer part of the part, which is located on the first side of the control gate electrode CG, of the p-type well PW1 in Embodiment 1, it is also possible to form the semiconductor region MV of the n-type at the upper layer part of the part, which is located on both the sides of the control gate electrode CG, of the p-type well PW1.

Figure 18:
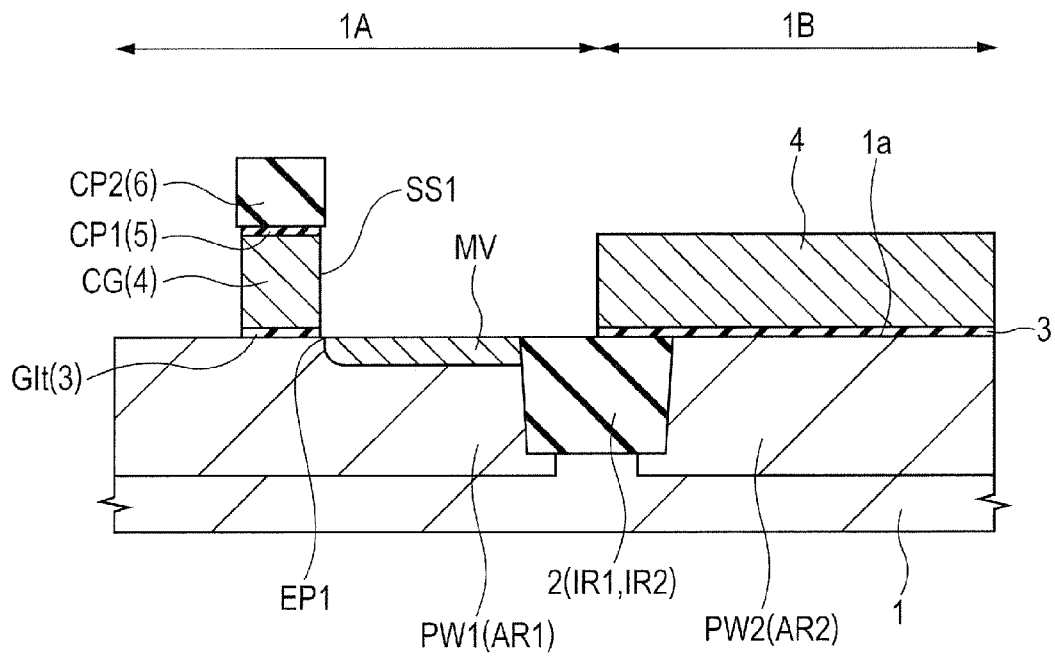
FIG. 18 is a sectional view showing a substantial part during a manufacturing step of the semiconductor device according to Embodiment 1.

Successively, as shown in FIG. 18, the sacrificial oxide films SOF1, SOF2, and SOF3 are removed (Step S10 in FIG. 4). At Step S10, the sacrificial oxide films SOF1, SOF2, and SOF3 are removed by wet etching using a hydrogen fluoride (HF) aqueous solution or the like for example. On this occasion, the sacrificial oxide film SOF11 is also removed. Here, it is also possible to clean the surface of the semiconductor substrate 1 by washing the surface of the semiconductor substrate 1.

Figure 19:
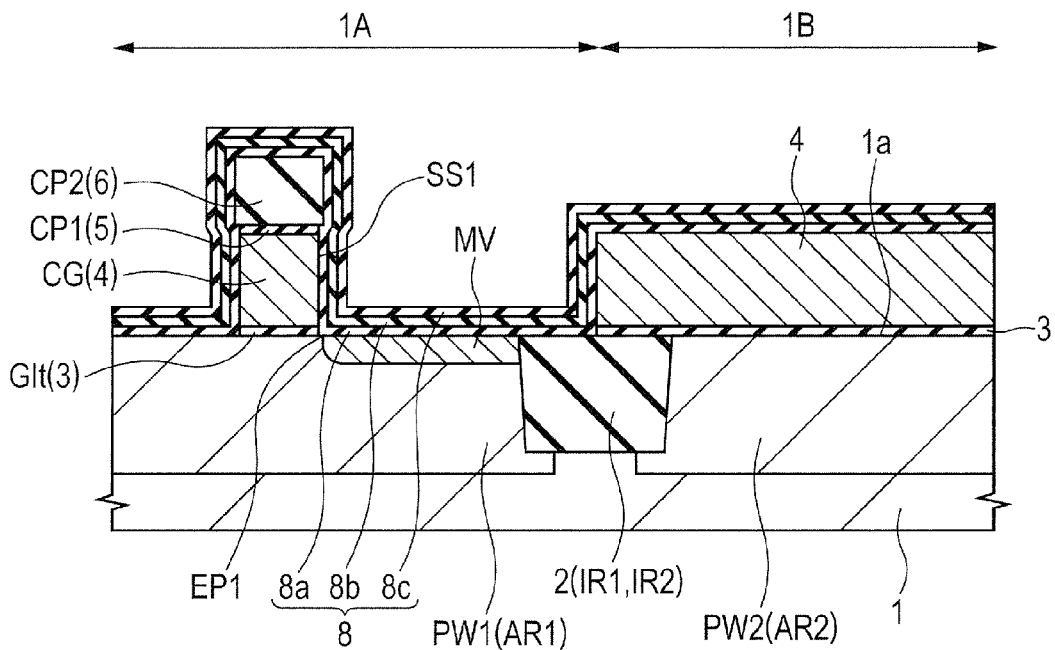
FIG. 19 is a sectional view showing a substantial part during a manufacturing step of the semiconductor device according to Embodiment 1.

Successively, as shown in FIG. 19, an insulating film 8 for a gate insulating film GIm of a memory transistor MT is formed over the whole main surface 1a of the semiconductor substrate 1 (Step S11 in FIG. 4). At Step S11, in the memory cell region 1A, the insulating film 8 is formed over the exposed part of the main surface 1a of the semiconductor substrate 1, the side surfaces of the control gate electrode CG, and the top surface and the side surfaces of the cap insulating film CP2. Further, the insulating film 8 is formed over the top surface and side surface of the part, which remains in the peripheral circuit region 1B, of the conductive film 4. That is, at Step S11, the insulating film 8 is formed so as to cover the main surface 1a of the semiconductor substrate 1, the side surfaces of the control gate electrode CG, the surfaces of the cap insulating film CP2, and the surfaces of the part, which remains in the peripheral circuit region 1B, of the conductive film 4.

The insulating film 8 is, as stated earlier, an insulating film having a charge accumulation section in the interior and, as an insulating film, comprises a laminated film of a silicon oxide film 8a, a silicon nitride film 8b, and a silicon oxide film 8c, those being formed from the bottom in sequence.

In the insulating film 8, the silicon oxide film 8a can be formed by a thermal oxidation method, an ISSG oxidation method, or the like for example. Further, in the insulating film 8, the silicon nitride film 8b can be formed by a CVD method for example. Furthermore, in the insulating film 8, the silicon oxide film 8c can be formed by a CVD method or an ISSG oxidation method for example.

Firstly, the silicon oxide film 8a is formed over the exposed part of the main surface 1a of the semiconductor substrate 1, the side surfaces of the control gate electrode CG, the top surface and the side surfaces of the cap insulating film CP2, and the top surface and the side surface of the part, which remains in the peripheral circuit region 1B, of the conductive film 4 by a thermal oxidation method or an ISSG oxidation method for example. On this occasion, the exposed part of the main surface 1a of the semiconductor substrate 1, the side surfaces of the control gate electrode CG, the top surface and the side surfaces of the part of the cap insulating film CP2, and the top surface and the side surface of the part, which remains in the peripheral circuit region 1B, of the conductive film 4 are oxidized. The thickness of the silicon oxide film 8a can be set at about 4 nm for example.

As another feature, it is also possible to form the silicon oxide film 8a by an ALD method. On this occasion, silicon oxide grows over the exposed part of the main surface 1a of the semiconductor substrate 1, the side surfaces of the control gate electrode CG, the top surface and the side surfaces of the cap insulating film CP2, and the top surface and the side surface of the part, which remains in the peripheral circuit region 1B, of the conductive film 4. As a result, on this occasion too, the exposed part of the main surface 1a of the semiconductor substrate 1, the side surfaces of the control gate electrode CG, the top surface and the side surfaces of the cap insulating film CP2, and the top surface and the side surface of the part, which remains in the peripheral circuit region 1B, of the conductive film 4 are covered with an oxide film.

Successively, the silicon nitride film 8b is formed over the silicon oxide film 8a by a CVD method for example and further the silicon oxide film 8c is formed over the silicon nitride film 8b by a CVD method, an ISSG oxidation method, or both the methods for example. As a result, it is possible to form the insulating film 8 comprising the laminated film of the silicon oxide film 8a, the silicon nitride film 8b, and the silicon oxide film 8c.

The insulating film 8 formed in the memory cell region 1A functions as a gate insulating film of a memory gate electrode MG (refer to FIG. 21 described later) and has a charge retention function. The insulating film 8 has a structure formed by interposing the silicon nitride film 8b as the charge accumulation section between the silicon oxide film 8a and the silicon oxide film 8c, those functioning as charge block layers. Then the potential barrier height of the charge block layers comprising the silicon oxide film 8a and the silicon oxide film 8c is larger than the potential barrier height of the charge accumulation section comprising the silicon nitride film 8b.

Here, the silicon nitride film 8b is used as an insulating film having a trap level in Embodiment 1 and the use of the silicon nitride film 8b is desirable from the viewpoint of reliability. As an insulating film having a trap level however, the insulating film is not limited to a silicon nitride film and a high permittivity film having a permittivity higher than the silicon nitride film such as an aluminum oxide (alumina) film, a hafnium oxide film, or a tantalum oxide film can be used for example.

Figure 20:
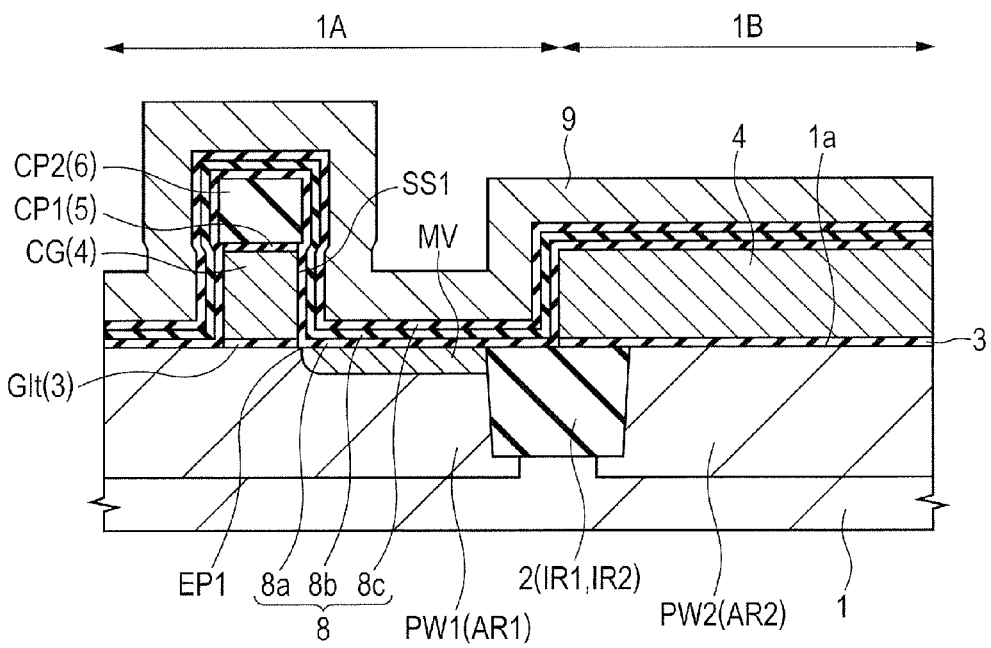
FIG. 20 is a sectional view showing a substantial part during a manufacturing step of the semiconductor device according to Embodiment 1.

Successively, as shown in FIG. 20, a conductive film 9 comprising silicon is formed over the whole main surface 1a of the semiconductor substrate 1, namely over the insulating film 8 (Step S12 in FIG. 5).

Preferably, the conductive film 9 comprises a polycrystal silicon film, namely a polysilicon film, for example. The conductive film 9 can be formed by a CVD method or the like. Further, when the film is formed, it is also possible to: form the conductive film 9 as an amorphous silicon film; and then convert the amorphous silicon film to a polycrystal silicon film through succeeding heat treatment.

As the conductive film 9, a substance having a low resistivity by introducing impurities of the n-type such as phosphorus (P) or arsenic (As) or impurities of the p-type such as boron (B) is preferably used for example. The impurities can be introduced during or after the forming of the conductive film 9. It is possible to introduce impurities into the conductive film 9 by ion implantation after the forming of the conductive film 9 but it is also possible to introduce impurities into the conductive film 9 during the forming of the conductive film 9. When the impurities are introduced during the forming of the conductive film 9, it is possible to form the conductive film 9 into which the impurities are introduced by mixing a doping gas with a gas for forming the conductive film 9.

Figure 21:
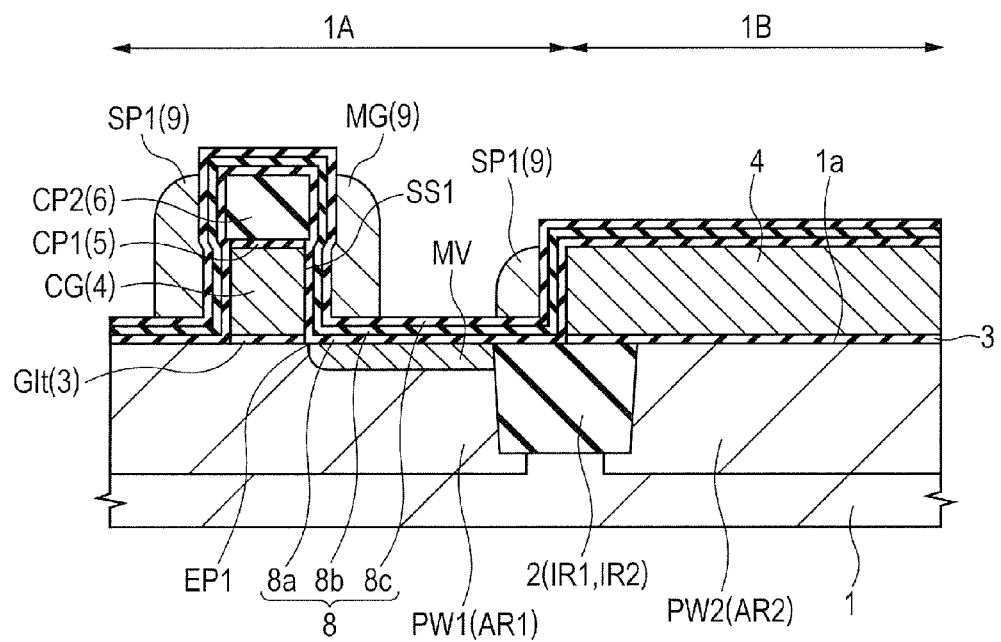
FIG. 21 is a sectional view showing a substantial part during a manufacturing step of the semiconductor device according to Embodiment 1.

Successively, as shown in FIG. 21, the conductive film 9 is etched back by an anisotropic etching technology and a memory gate electrode MG is formed (Step S13 in FIG. 5).

At Step S13, by etching back the conductive film 9 to the extent corresponding to the film thickness of the conductive film 9, the conductive film 9 remains in the shape of a sidewall spacer over the sidewalls, namely over the side surfaces, on both the sides of the control gate electrode CG with the insulating film 8 interposed and the conductive film 9 in the other regions is removed.

As a result, as shown in FIG. 21, in the memory cell region 1A, the memory gate electrode MG comprising the conductive film 9 remaining in the shape of a sidewall spacer over the sidewall on the first side, namely on the side where the memory gate electrode MG adjacent to the control gate electrode CG is arranged, in the sidewalls on both the sides of the control gate electrode CG with the insulating film 8 interposed is formed. Further, a spacer SP1 comprising the conductive film 9 remaining in the shape of a sidewall spacer over the sidewall on the side opposite to the first side, namely on the side opposite to the side where the memory gate electrode MG adjacent to the control gate electrode CG is arranged, in the sidewalls on both the sides of the control gate electrode CG with the insulating film 8 interposed is formed.

The memory gate electrode MG is formed over the insulating film 8 so as to be adjacent to the control gate electrode CG with the insulating film 8 interposed. The memory gate electrode MG and the spacer SP1 are formed over the sidewalls on both the sides opposite to each other of the control gate electrode CG and are structured nearly symmetrically with the control gate electrode CG interposed.

The cap insulating film CP2 is formed over the control gate electrode CG with the cap insulating film CP1 interposed. Consequently, the memory gate electrode MG comprises the conductive film 9 remaining in the shape of a sidewall spacer over the sidewall on the first side of the cap insulating film CP2 with the insulating film 8 interposed. Further, the spacer SP1 comprises the conductive film 9 remaining in the shape of a sidewall spacer over the sidewall on the side opposite to the first side of the cap insulating film CP2 with the insulating film 8 interposed.

Here, a spacer SP1 comprising the conductive film 9 remaining in the shape of a sidewall spacer is also formed over the side surface of the conductive film 4 remaining in the peripheral circuit region 1B with the insulating film 8 interposed.

The insulating film 8 is interposed between the memory gate electrode MG formed at Step S13 and the p-type well PW1 in the semiconductor substrate 1 and between the memory gate electrode MG and the control gate electrode CG and the memory gate electrode MG is comprised of the conductive film 9 being in contact with the insulating film 8.

At the stage of applying the etch back process of Step S13, the part not covered with any of the memory gate electrode MG and the spacers SP1 in the insulating film 8, namely the part of the insulating film 8 not covered with any of the memory gate electrode MG and the spacers SP1, is exposed. The insulating film 8 under the memory gate electrode MG in the memory cell region 1A comes to be a gate insulating film GIm (refer to FIG. 23 described later) of a memory transistor MT. Further, it is possible to adjust a memory gate length by adjusting the film thickness of the conductive film 9 formed at Step S12.

Figure 22:
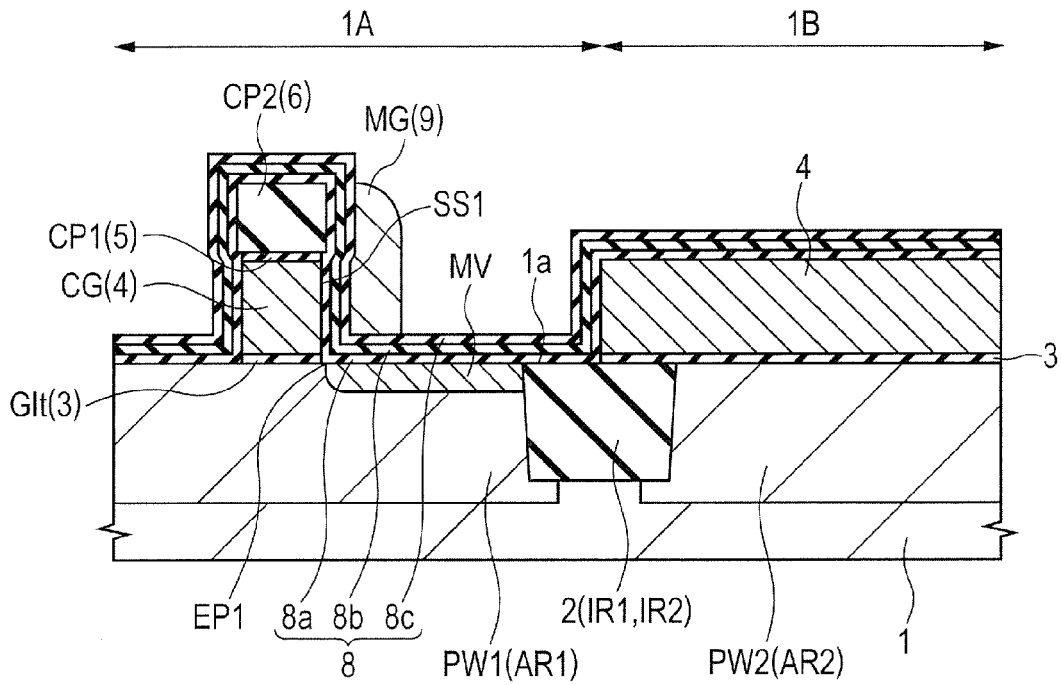
FIG. 22 is a sectional view showing a substantial part during a manufacturing step of the semiconductor device according to Embodiment 1.

Successively, as shown in FIG. 22, the spacers SP1 are removed (Step S14 in FIG. 5). At Step S14, such a resist pattern (not shown in the figure) as to cover the memory gate electrode MG and expose the spacers SP1 is formed over the semiconductor substrate 1 by photolithography. Then the spacers SP1 are removed by dry etching with the formed resist pattern used as an etching mask. Meanwhile, the memory gate electrode MG remains without etched because it has been covered with the resist pattern. Thereafter, the resist pattern is removed.

Figure 23:
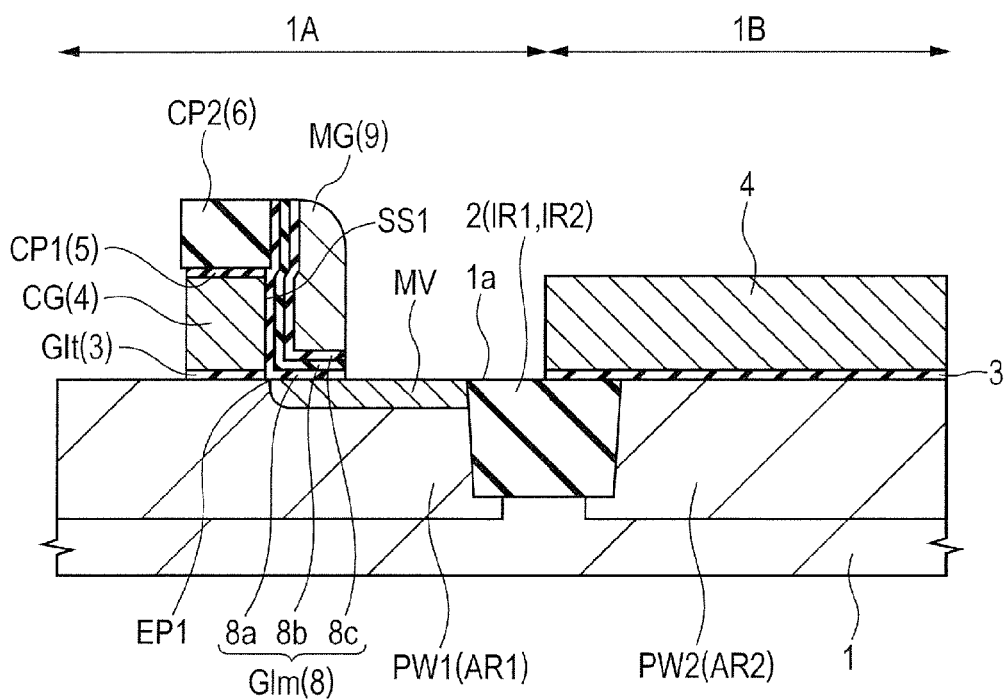
FIG. 23 is a sectional view showing a substantial part during a manufacturing step of the semiconductor device according to Embodiment 1.

Successively, as shown in FIG. 23, the part, which is not covered with the memory gate electrode MG, of the insulating film 8 is removed by etching such as wet etching for example (Step S15 in FIG. 5). On this occasion, in the memory cell region 1A, the insulating film 8 located between the memory gate electrode MG and the p-type well PW1 and between the memory gate electrode MG and the control gate electrode CG remains without removed and the insulating film 8 located in other regions is removed. On this occasion, in the memory cell region 1A, a gate insulating film GIm comprising the part, which remains between the memory gate electrode MG and the p-type well PW1, of the insulating film 8 and the part, which remains between the memory gate electrode MG and the control gate electrode CG, of the insulating film 8 is formed.

Here, at Step S15, it is also possible to apply etching so that, in the insulating film 8, the silicon oxide film 8c and the silicon nitride film 8b may be removed and the silicon oxide film 8a may remain without removed.

Figure 24:
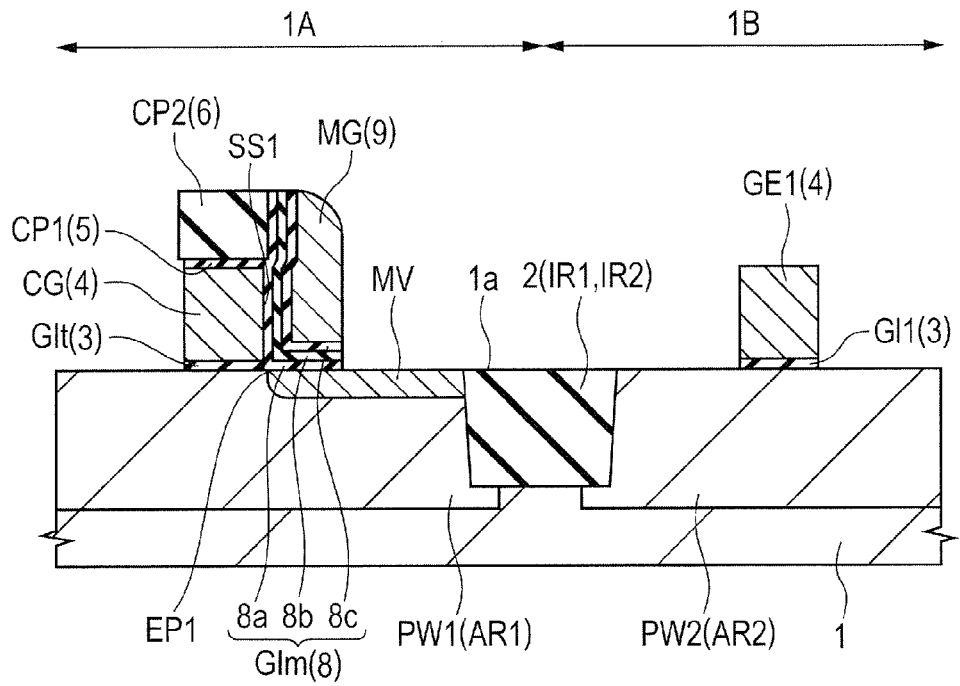
FIG. 24 is a sectional view showing a substantial part during a manufacturing step of the semiconductor device according to Embodiment 1.

Successively, as shown in FIG. 24, in the peripheral circuit region 1B, the conductive film 4 is patterned (Step S16 in FIG. 5). At Step S16, the conductive film 4 is patterned in the peripheral circuit region 1B by photolithography and etching for example. It is also possible to form a silicon oxide film and a silicon nitride film before a resist is applied for example. Those films function as memory section protective films when the conductive film 4 is patterned in the peripheral circuit region 1B (not shown in the figure).

Firstly, a resist film is formed over the whole main surface 1a in the semiconductor substrate 1. Successively, in the peripheral circuit region 1B, in the region other than the region where a gate electrode GE1 is to be formed, openings penetrating the resist film and reaching the conductive film 4 are formed and a resist pattern comprising the resist film in which the openings are formed is formed. On this occasion, the part, which is arranged in the region where the gate electrode GE1 is to be formed, of the conductive film 4 in the peripheral circuit region 1B and the main surface 1a of the semiconductor substrate 1 in the memory cell region 1A are covered with the resist film.

Successively, the conductive film 4 is etched and patterned by dry etching or the like with the resist pattern used as an etching mask for example. As a result, in the peripheral circuit region 1B, a gate electrode GE1 comprising the conductive film 4 is formed and a gate insulating film GI1 comprising the insulating film 3 between the gate electrode GE1 and the p-type well PW2 in the semiconductor substrate 1 is formed. That is, the gate electrode GE1 is formed over the p-type well PW2 in the semiconductor substrate 1 with the gate insulating film GI1 interposed in the peripheral circuit region 1B. Meanwhile, in the memory cell region 1A, since the memory gate electrode MG and the control gate electrode CG are covered with the resist pattern, the memory gate electrode MG and the control gate electrode CG are not etched. Successively, the resist pattern, namely the resist film, is removed.

Here, in the peripheral circuit region 1B, the part, which is not covered with the gate electrode GE1, of the insulating film 3 can be removed by applying dry etching of Step S16 or by applying wet etching after the dry etching of Step S16.

Figure 25:
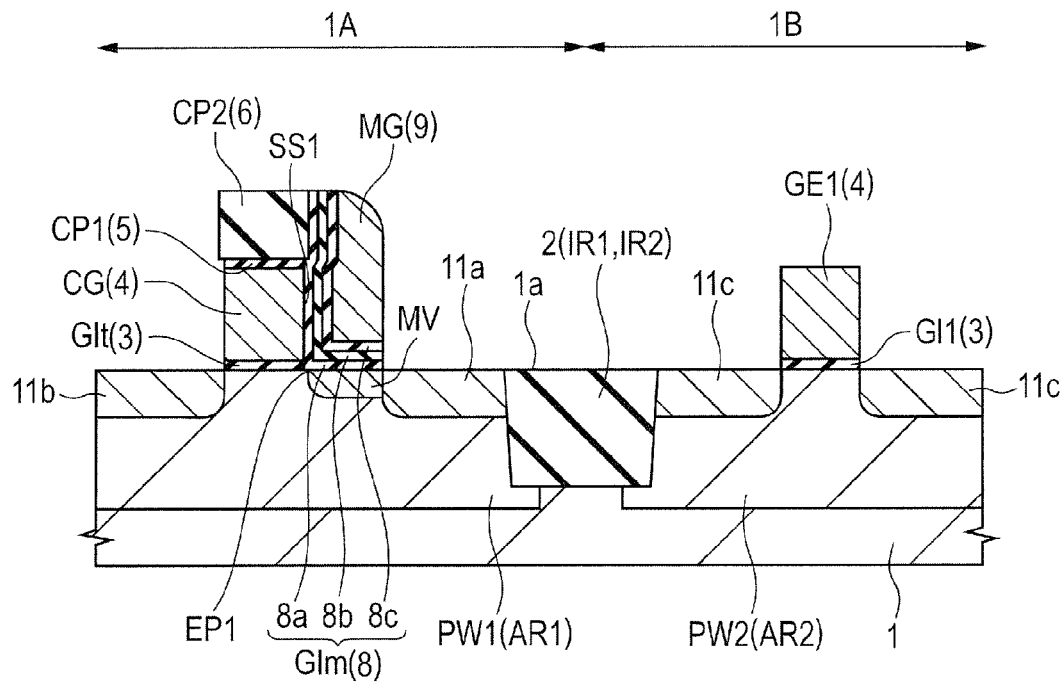
FIG. 25 is a sectional view showing a substantial part during a manufacturing step of the semiconductor device according to Embodiment 1.

Successively, as shown in FIG. 25, n$^-$-type semiconductor regions 11a, 11b, and 11c are formed by an ion implantation method or the like (Step S17 in FIG. 5). At Step S17, impurities of the n-type such as arsenic (As) or phosphorus (P) are introduced into the p-type wells PW1 and PW2 and the semiconductor region MV in the semiconductor substrate 1 with the control gate electrode CG, the memory gate electrode MG, and the gate electrode GE1 used as masks for example. As a result, the n$^-$-type semiconductor regions 11a, 11b, and 11c are formed.

On this occasion, the n$^-$-type semiconductor region 11a is formed self-alignedly at the side surface of the memory gate electrode MG in the memory cell region 1A. Further, the n$^-$-type semiconductor region 11b is formed self-alignedly at the side surface of the control gate electrode CG in the memory cell region 1A. Furthermore, the n$^-$-type semiconductor region 11c is formed self-alignedly at the side surfaces of the gate electrode GE1 in the peripheral circuit region 1B. The n$^-$-type semiconductor regions 11a, 11b, and 11c can be formed through an identical ion implantation step but can also be formed through different ion implantation steps.

Figure 26:
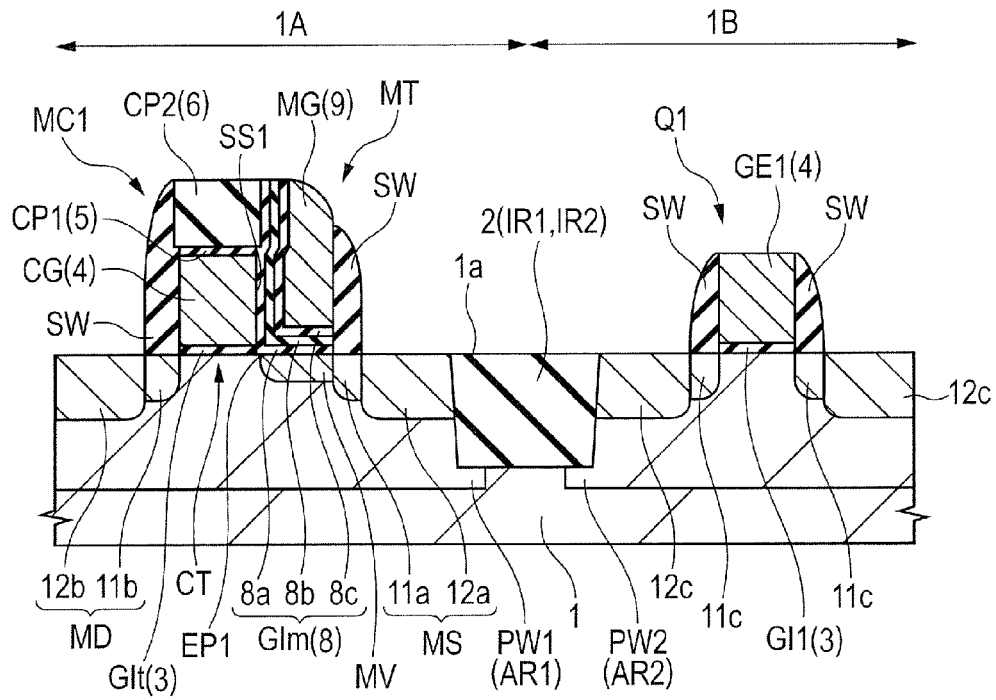
FIG. 26 is a sectional view showing a substantial part during a manufacturing step of the semiconductor device according to Embodiment 1.

Successively, as shown in FIG. 26, sidewall spacers SW are formed over the sidewall of the control gate electrode CG, over the sidewall of the memory gate electrode MG, and over the sidewalls of the gate electrode GE1 (Step S18 in FIG. 5).

Firstly, an insulating film for sidewall spacers SW is formed over the whole main surface 1a of the semiconductor substrate 1 and the formed insulating film is etched back by anisotropic etching for example. In this way, the sidewall spacers SW are formed by selectively leaving the insulating film over the sidewall of the control gate electrode CG, over the sidewall of the memory gate electrode MG, and over the sidewalls of the gate electrode GE1. The sidewall spacers SW comprise an insulating film such as a silicon oxide film, a silicon nitride film, or a laminated film of those.

Successively, n$^+$-type semiconductor regions 12a, 12b, and 12c are formed by an ion implantation method or the like (Step S19 in FIG. 5). At Step S19, impurities of the n-type such as arsenic (As) or phosphorus (P) are introduced into the p-type wells PW1 and PW2 in the semiconductor substrate 1 with the control gate electrode CG, the memory gate electrode MG, the gate electrode GE1, and the sidewall spacers SW over the sidewalls of those used as masks for example. As a result, the n$^+$-type semiconductor regions 12a, 12b, and 12c are formed.

On this occasion, the n$^+$-type semiconductor region 12a is formed self-alignedly at the sidewall spacer SW over the sidewall of the memory gate electrode MG in the memory cell region 1A. Further, the n$^+$-type semiconductor region 12b is formed self-alignedly at the sidewall spacer SW over the sidewall of the control gate electrode CG in the memory cell region 1A. Furthermore, the n$^+$-type semiconductor region 12c is formed self-alignedly at the sidewall spacers SW over both the sidewalls of the gate electrode GE1 in the peripheral circuit region 1B. As a result, an LDD structure is formed. The n$^+$-type semiconductor regions 12a, 12b, and 12c can be formed through an identical ion implantation step but can also be formed through different ion implantation steps.

In this way, an n-type semiconductor region MS functioning as a source region of a memory transistor MT comprises the n$^-$-type semiconductor region 11a and the n$^+$-type semiconductor region 12a having an impurity concentration higher than the n$^-$-type semiconductor region 11a. Further, an n-type semiconductor region MD functioning as a drain region of a control transistor CT comprises the n$^-$-type semiconductor region 11b and the n$^+$-type semiconductor region 12b having an impurity concentration higher than the n$^-$-type semiconductor region 11b. The semiconductor region MS is formed at the upper layer part of the part, which is located on the side opposite to the control gate electrode CG, of the p-type well PW1, namely the semiconductor substrate 1, with the memory gate electrode MG interposed in plan view. The semiconductor region MD is formed at the upper layer part of the part, which is located on the side opposite to the memory gate electrode MG, of the p-type well PW1 with the control gate electrode CG interposed in plan view.

Successively, activation annealing that is heat treatment for activating the impurities introduced into the n$^-$-type semiconductor regions 11a, 11b, and 11c, the n$^+$-type semiconductor regions 12a, 12b, and 12c, and the like is applied. As a result, as shown in FIG. 26, in the memory cell region 1A, a control transistor CT and a memory transistor MT are formed and a memory cell MC1 as a nonvolatile memory comprises the control transistor CT and the memory transistor MT. That is, the memory cell MC1 as a nonvolatile memory comprises the control gate electrode CG, the gate insulating film GIt, the memory gate electrode MG, and the gate insulating film GIm.

Further, as shown in FIG. 26, a MISFET Q1 is formed in the peripheral circuit region 1B. That is, the MISFET Q1 comprises the gate electrode GE1 and the gate insulating film GI1.

Figure 27:
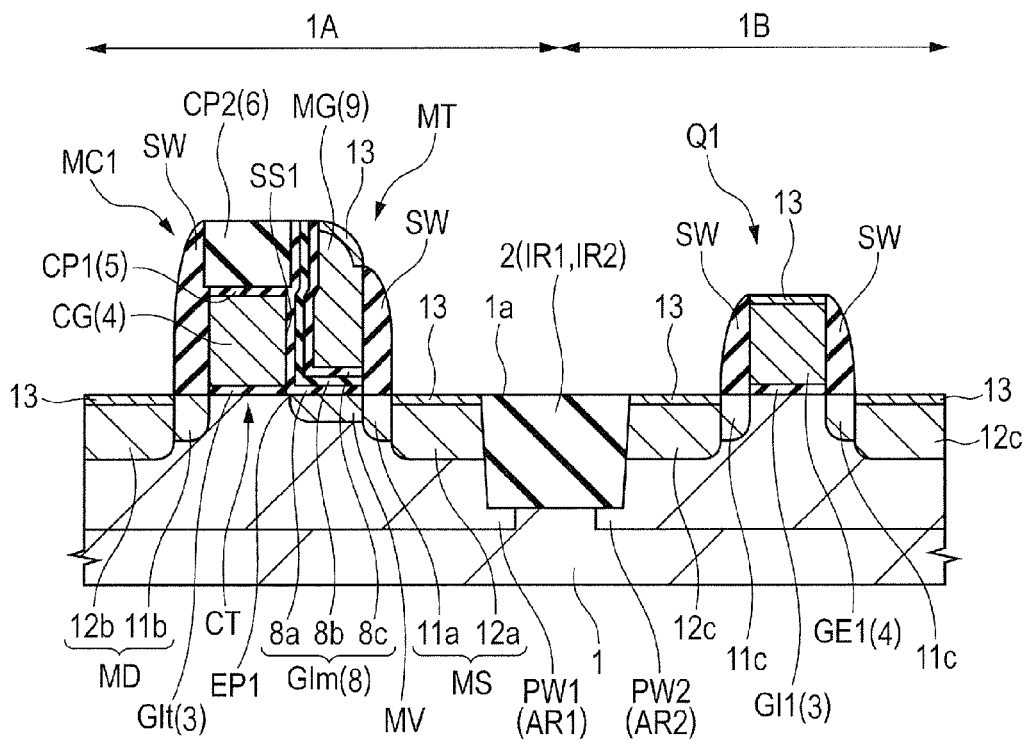
FIG. 27 is a sectional view showing a substantial part during a manufacturing step of the semiconductor device according to Embodiment 1.

Successively, as shown in FIG. 27, a metal silicide layer 13 is formed (Step S20 in FIG. 5). At Step S20, a metal film is formed over the whole main surface 1a of the semiconductor substrate 1 so as to cover the cap insulating film CP2, the gate insulating film GIm, the memory gate electrode MG, the gate electrode GE1, and the sidewall spacers SW. The metal film comprises a cobalt (Co) film, a nickel (Ni) film, a nickel platinum alloy film, or the like and can be formed by a sputtering method or the like for example. Then the respective upper layer parts of the n$^+$-type semiconductor regions 12a, 12b, and 12c react with the metal film by applying heat treatment to the semiconductor substrate 1. As a result, the metal silicide layer 13 is formed over the respective n$^+$-type semiconductor regions 12a, 12b, and 12c.

The metal silicide layer 13 can comprise a cobalt silicide layer, a nickel silicide layer, or a platinum-added nickel silicide layer for example. Successively, an unreacted metal film is removed. By applying a so-called salicide process, as shown in FIG. 27, it is possible to form the metal silicide layer 13 over the respective n$^+$-type semiconductor regions 12a, 12b, and 12c. Here, it is also possible to form the metal silicide layer 13 over the memory gate electrode MG and the gate electrode GE1.

Figure 28:
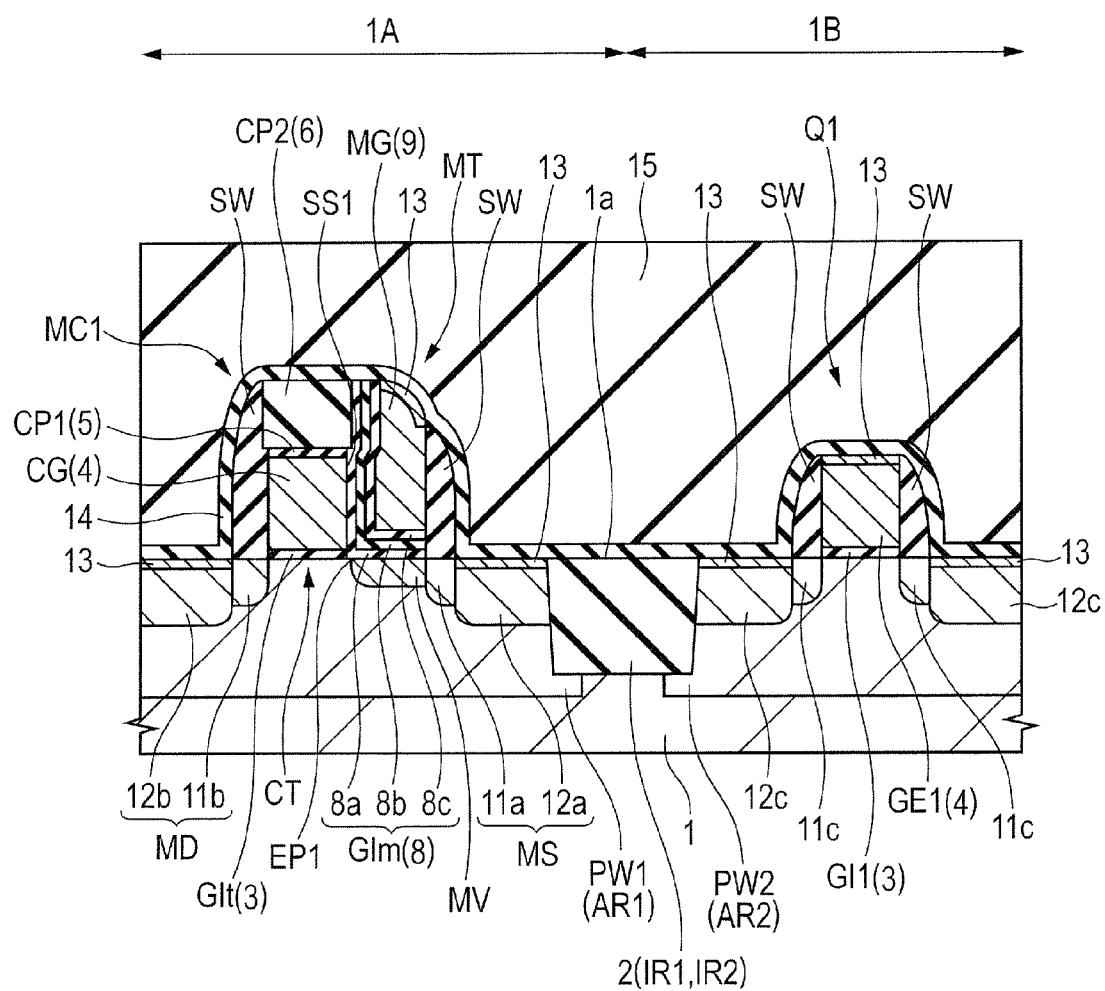
FIG. 28 is a sectional view showing a substantial part during a manufacturing step of the semiconductor device according to Embodiment 1.

Successively, as shown in FIG. 28, an insulating film 14 and an interlayer insulating film 15 are formed over the whole main surface 1a of the semiconductor substrate 1 (Step S21 in FIG. 5). At Step S21, firstly the insulating film 14 is formed so as to cover the cap insulating film CP2, the gate insulating film GIm, the memory gate electrode MG, the gate electrode GE1, and the sidewall spacers SW. The insulating film 14 comprises a silicon nitride film for example. The insulating film 14 can be formed by a CVD method for example.

Successively, as shown in FIG. 28, the interlayer insulating film 15 is formed over the insulating film 14. The interlayer insulating film 15 comprises a monolithic film of a silicon oxide film, a laminated film of a silicon nitride film and a silicon oxide film, or the like. After the interlayer insulating film 15 is formed by a CVD method, the top surface of the interlayer insulating film 15 is flattened for example.

Successively, as shown in FIG. 1, plugs PG penetrating the interlayer insulating film 15 are formed (Step S22 in FIG. 5). Firstly, contact holes CNT are formed in the interlayer insulating film 15 by dry-etching the interlayer insulating film 15 with a resist pattern (not shown in the figure) formed over the interlayer insulating film 15 by photolithography used as an etching mask. Successively, the conductive plugs PG comprising tungsten (W) or the like are formed as conductive sections in the contact holes CNT.

In order to form the plugs PG, a barrier conductive film comprising a titanium (Ti) film, a titanium nitride (TiN) film, or a laminated film of those for example is formed over the interlayer insulating film 15 including the interiors of the contact holes CNT for example. Then a principal conductive film comprising a tungsten (W) film or the like is formed over the barrier conductive film so as to fill the contact holes CNT and the unnecessary principal conductive film and barrier conductive film over the interlayer insulating film 15 are removed by a CMP (Chemical Mechanical Polishing) method, an etch back method, or the like. As a result, the plugs PG can be formed. Here, in FIG. 1, the barrier conductive film and the principal conductive film configuring the plugs PG are shown integrally in order to simplify the drawing.

The contact holes CNT and the plugs PG embedded into them are formed over the n$^+$-type semiconductor regions 12a, 12b, and 12c, over the control gate electrode CG, over the memory gate electrode MG, over the gate electrode GE1, and over others. At the bottoms of the contact holes CNT, parts of the metal silicide layer 13 over the surfaces of the n$^+$-type semiconductor regions 12a, 12b, and 12c, a part of the metal silicide layer 13 over the surface of the control gate electrode CG, and a part of the metal silicide layer 13 over the surface of the memory gate electrode MG are exposed for example. Otherwise, at the bottoms of the contact holes CNT, a part of the metal silicide layer 13 over the surface of the gate electrode GE1 or the like is exposed for example. Here in FIG. 1, the situation where parts of the metal silicide layer 13 over the surfaces of the n$^+$-type semiconductor regions 12b and 12c are exposed at the bottoms of the contact holes CNT and are electrically coupled to the plugs PG filling the contact holes CNT is shown cross-sectionally.

In this way, a semiconductor device according to Embodiment 1 described earlier in reference to FIG. 1 is manufactured. Here, it is possible to form a wire using copper (Cu) as the principal conductive film over the interlayer insulating film 15 into which the plugs PG are embedded by a damascene technology for example but the explanations are omitted here.

<With Regard to Generation of Particle as Foreign Substance>

The generation of a particle as a foreign substance when a resist film is removed in a peripheral circuit region and the resist film remains in a memory cell region at Step S8 in FIG. 4 is explained hereunder in contradistinction to a manufacturing method of a semiconductor device according to Comparative Example 1. FIGS. 29 to 32 are sectional views showing a substantial part during manufacturing steps of a semiconductor device according to Comparative Example 1.

A manufacturing method of a semiconductor device according to Comparative Example 1 is a method of manufacturing a semiconductor device according to Comparative Example 1 through steps corresponding to Step S1 in FIG. 4 to Step S22 in FIG. 5.

Figure 29:
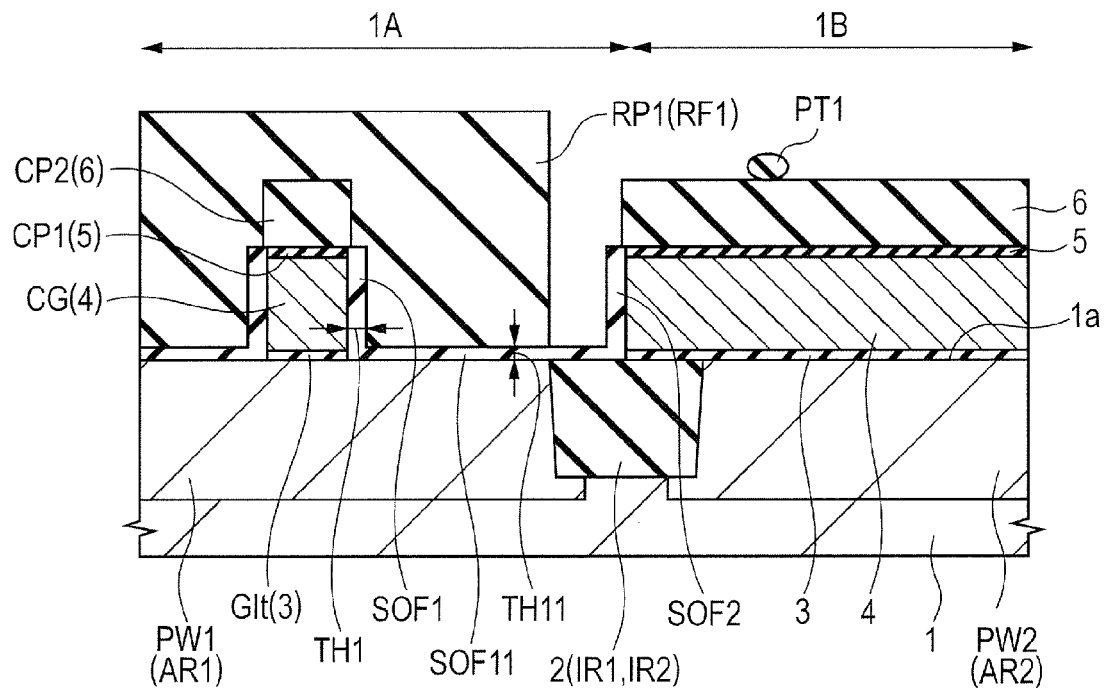
FIG. 29 is a sectional view showing a substantial part during a manufacturing step of a semiconductor device according to Comparative Example 1.

The manufacturing step of a semiconductor device according to Comparative Example 1 is, unlike the manufacturing step of a semiconductor device according to Example 1, at a step corresponding to Step S7 in FIG. 4, sacrificial oxide films are formed only by a thermal oxidation method without applying an ISSG oxidation method. As a result, as shown in FIG. 29, a sacrificial oxide film is not formed over the surface of a cap insulating film CP2 in a memory cell region 1A and a sacrificial oxide film is not formed over the surface of an insulating film 6 in a peripheral circuit region 1B. Consequently, a resist film RF1 formed through a step corresponding to Step S8 in FIG. 4 is in contact with the cap insulating film CP2 in the memory cell region 1A and is in contact with the insulating film 6 in the peripheral circuit region 1B.

Successively, after the resist film RF1 is exposed for patterning, the resist film RF1 is patterned by developing, is removed in the peripheral circuit region 1B, and remains in the memory cell region 1A. As a result, as shown in FIG. 29, a resist pattern RP1 comprising the part, which remains in the memory cell region 1A, of the resist film RF1 is formed.

As stated earlier, it sometimes happens that a particle PT1 as a foreign substance may be generated when the resist film RF1 is developed after it is exposed for patterning. The particle PT1 is either a particle comprising an organic substance contained in the resist film RF1 or a particle as a foreign substance contained in a liquid developer used for development for example. On this occasion, the generated particle PT1 adheres to the top surface of the insulating film 6 in the peripheral circuit region 1B as shown in FIG. 29.

The adhesiveness between the top surface of the insulating film 6 and the particle PT1 is large however. This is presumably because chemical reaction occurs at the contact interface between the insulating film 6 comprising a silicon nitride film and the particle PT1 comprising an organic substance and hence the adhesiveness between the top surface of the insulating film 6 and the particle PT1 increases for example. Consequently, in the peripheral circuit region 1B, the particle PT1 adhering to the top surface of the insulating film 6 does not break away from the top surface of the insulating film 6 at the step of etching the insulating film 6. As a result, the particle PT1 adhering to the top surface of the insulating film 6 comes to be an etching mask used when the insulating film 6 is etched.

Figure 30:
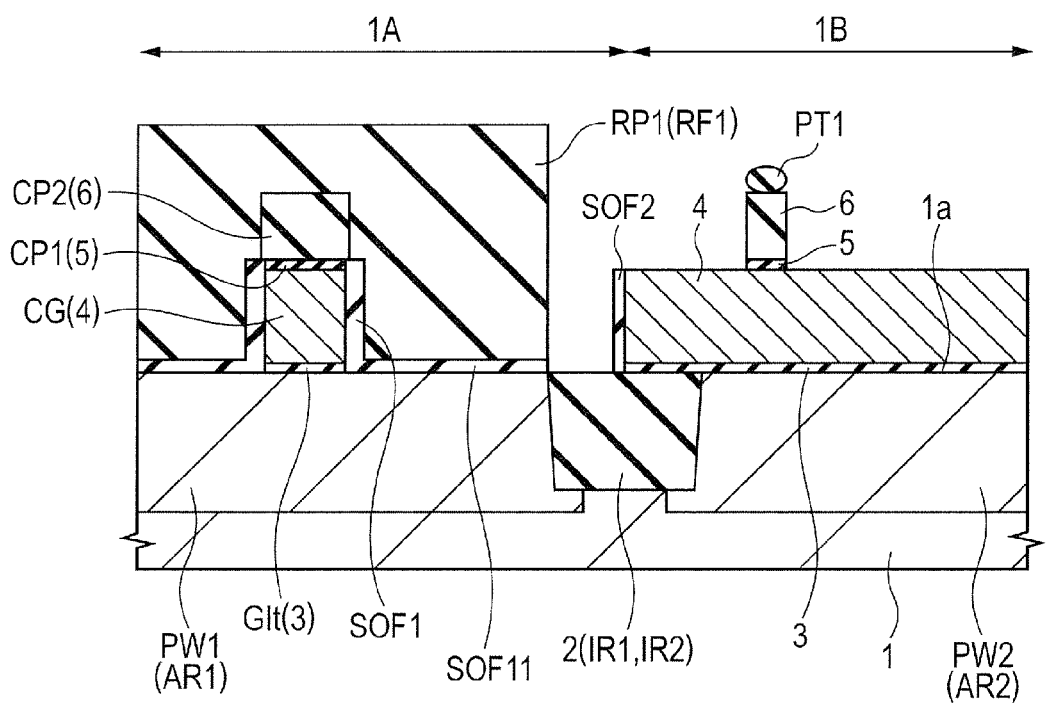
FIG. 30 is a sectional view showing a substantial part during a manufacturing step of the semiconductor device according to Comparative Example 1.

As shown in FIG. 30 therefore, at the step of etching the insulating film 6, since the particle PT1 and the part, to the top surface of which the particle PT1 adheres, of the insulating film 6 remain, the part, which remains in the peripheral circuit region 1B, of the insulating film 6 cannot completely be removed. That is, when the insulating film 6 is etched, since the part, to the top surface of which the particle PT1 adheres, of the insulating film 6 remains, the part to be etched of the insulating film 6 remains without etched.

Figure 31:
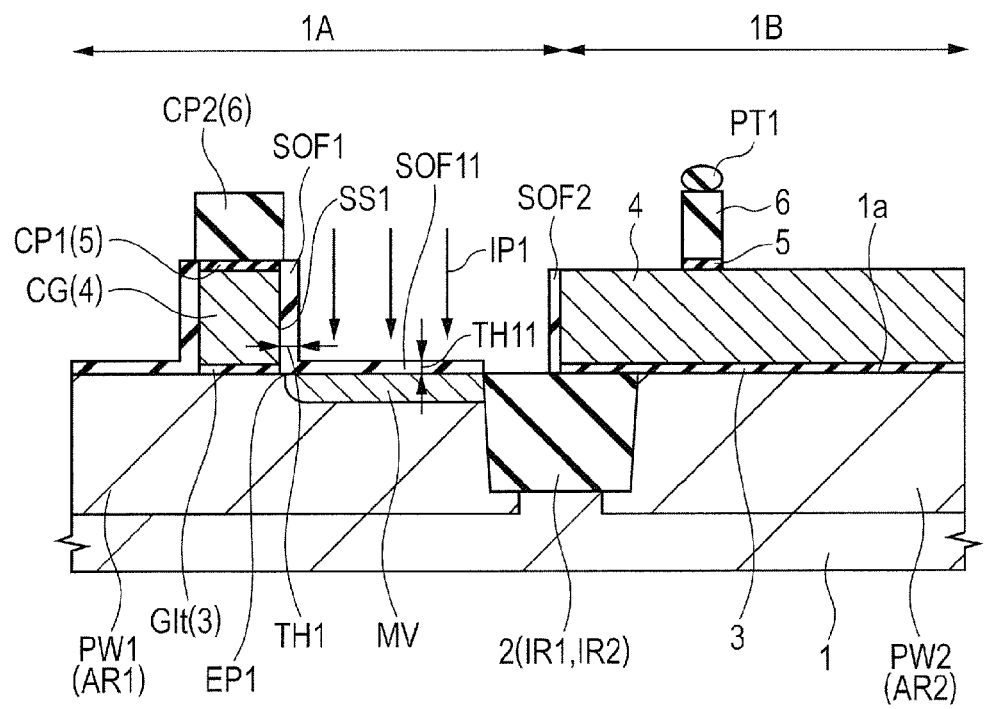
FIG. 31 is a sectional view showing a substantial part during a manufacturing step of the semiconductor device according to Comparative Example 1.
Figure 32:
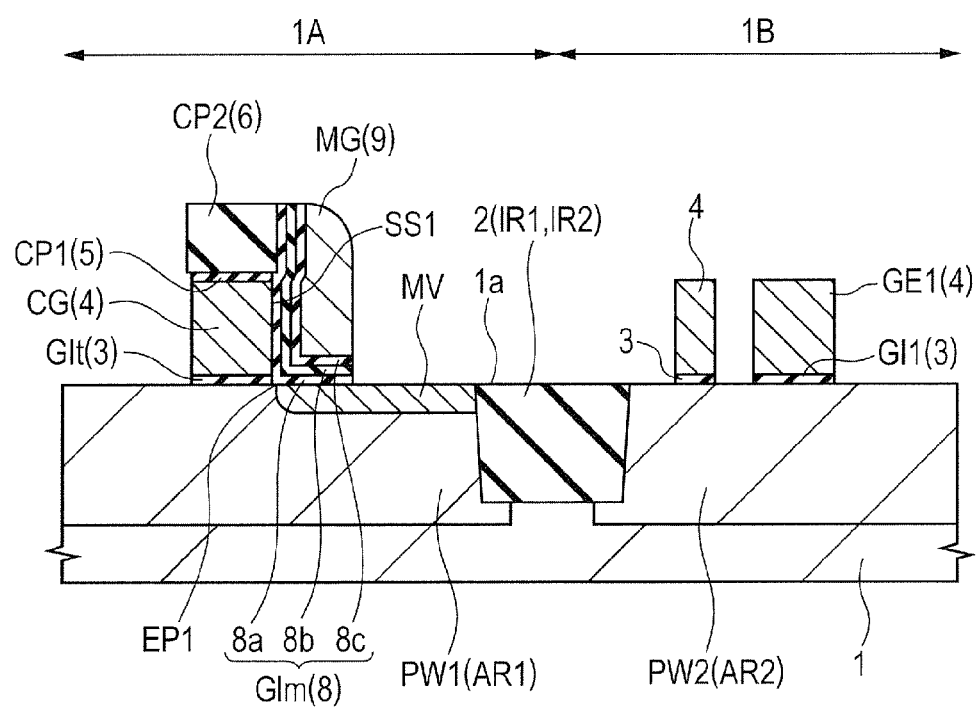
FIG. 32 is a sectional view showing a substantial part during a manufacturing step of the semiconductor device according to Comparative Example 1.

Successively, even when the part, which remains in the memory cell region 1A, of the resist film RF1, namely the resist pattern RP1, is removed and a semiconductor region MV is formed by applying a step corresponding to Step S9 in FIG. 4, the particle PT1 and the part, to the top surface of which the particle PT1 adheres, of the insulating film 6 still remain as shown in FIG. 31. Then when a conductive film 4 is patterned in the peripheral circuit region 1B by applying the steps of Step S10 in FIG. 4 to Step S16 in FIG. 5, the part, which remains in the peripheral circuit region 1B, of the insulating film 6 comes to be an etching mask used when the conductive film 4 is patterned. As shown in FIG. 32 therefore, at the step of patterning the conductive film 4, the part, which is located under the insulating film 6, of the conductive film 4 remains and hence the conductive film 4 remains in the region other than the region where a gate electrode GE1 is to be formed in the peripheral circuit region 1B.

When the conductive film 4 remains in the region other than the region where the gate electrode GE1 is to be formed in this way, it is impossible to introduce a desired quantity of impurities of the n-type or the p-type into a p-type well PW2 in a semiconductor substrate 1 in the peripheral circuit region 1B when a step corresponding to Step S17 in FIG. 5 is successively applied for example. Consequently, it is impossible to form an $n^-$-type semiconductor region $11c$ or an $n^+$-type semiconductor region $12c$ as desired and the semiconductor device is damaged.

Otherwise, when the conductive film 4 remains in the region other than the region where the gate electrode GE1 is to be formed, for example, the remaining conductive film 4 connects with the gate electrode GE1, thereby the width of the gate electrode GE1, namely a channel length, varies, and the semiconductor device is damaged.

In the manufacturing step of a semiconductor device according to Embodiment 1 in contrast, sacrificial oxide films are formed by a thermal oxidation method and an ISSG oxidation method at Step S7 in FIG. 4. As a result, as shown in FIG. 11, the sacrificial oxide film SOF3 is formed over the surface of the cap insulating film CP2 in the memory cell region 1A and the sacrificial oxide film SOF4 is formed over the surface of the insulating film 6 in the peripheral circuit region 1B. As a result, as shown in FIG. 12, the resist film RF1 formed at Step S8 in FIG. 4 is in contact with the sacrificial oxide film SOF3 in the memory cell region 1A and is in contact with the sacrificial oxide film SOF4 in the peripheral circuit region 1B.

Successively, when the resist film RF1 is formed and the formed resist film RF1 is subjected to pattern exposure and thereafter development, a particle PT1 as a foreign substance may sometimes be generated. On that occasion, the generated particle PT1 adheres to the top surface of the sacrificial oxide film SOF4 in the peripheral circuit region 1B as shown in FIG. 13.

In Embodiment 1 however, the adhesiveness between the particle PT1 adhering to the top surface of the sacrificial oxide film SOF4 and the top surface of the sacrificial oxide film SOF4 is small. This is presumably because chemical reaction hardly occurs at the contact interface between the sacrificial oxide film SOF4 comprising a silicon oxide film and the particle PT1 comprising an organic substance and hence the adhesiveness between the top surface of the sacrificial oxide film SOF4 and the particle PT1 does not increase for example. As a result, the particle PT1 adhering to the top surface of the sacrificial oxide film SOF4 easily breaks away from the top surface of the sacrificial oxide film SOF4 at the initial stage of the step of etching the insulating film 6 as shown in FIG. 14. Consequently, it is possible to prevent the particle PT1 adhering to the top surface of the sacrificial oxide film SOF4 from becoming an etching mask used when the insulating film 6 is etched. As shown in FIG. 15 therefore, it is possible to completely remove the part, which remains in the peripheral circuit region 1B, of the insulating film 6 at the step of etching the insulating film 6.

Further, at the step of patterning the conductive film 4 (Step S16 in FIG. 5), it is possible to prevent the conductive film 4 from remaining in the region other than the region where the gate electrode GE1 is to be formed in the peripheral circuit region 1B. Consequently, it is possible to: form an $n^-$-type semiconductor region $11c$ or an $n^+$-type semiconductor region $12c$ as desired; and prevent the semiconductor device from being damaged. Otherwise, it is possible to: prevent the width of the gate electrode GE1, namely a channel length, from varying; and prevent the semiconductor device from being damaged.

<With Regard to Position of End of Semiconductor Region>

Figure 33:
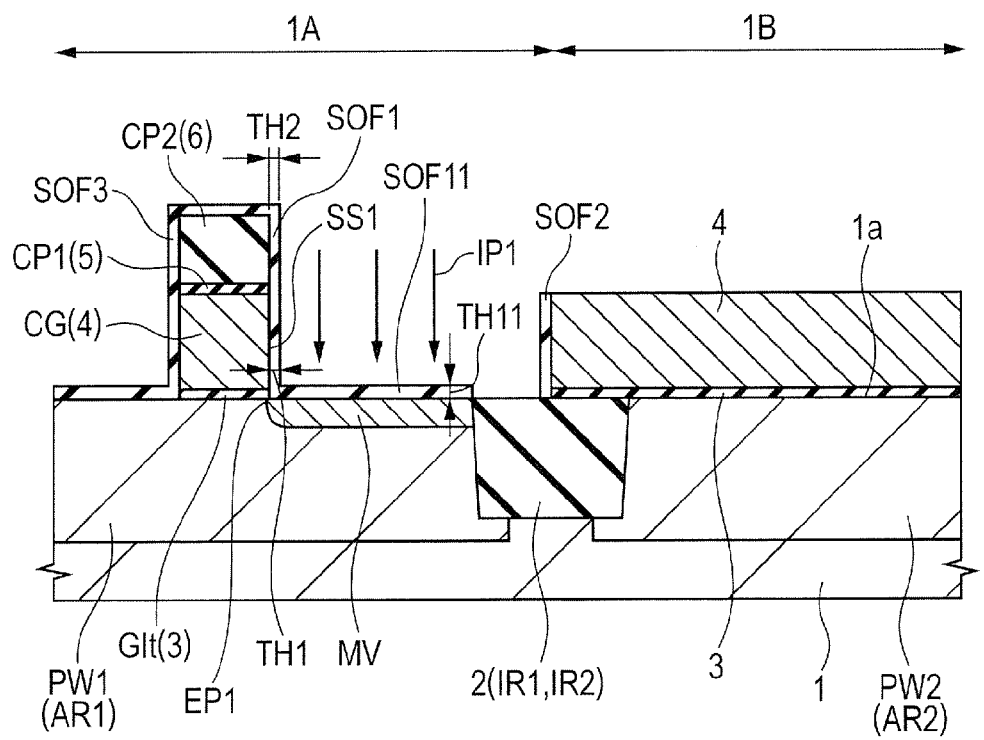
FIG. 33 is a sectional view showing a substantial part during a manufacturing step of a semiconductor device according to Comparative Example 2.
Figure 34:
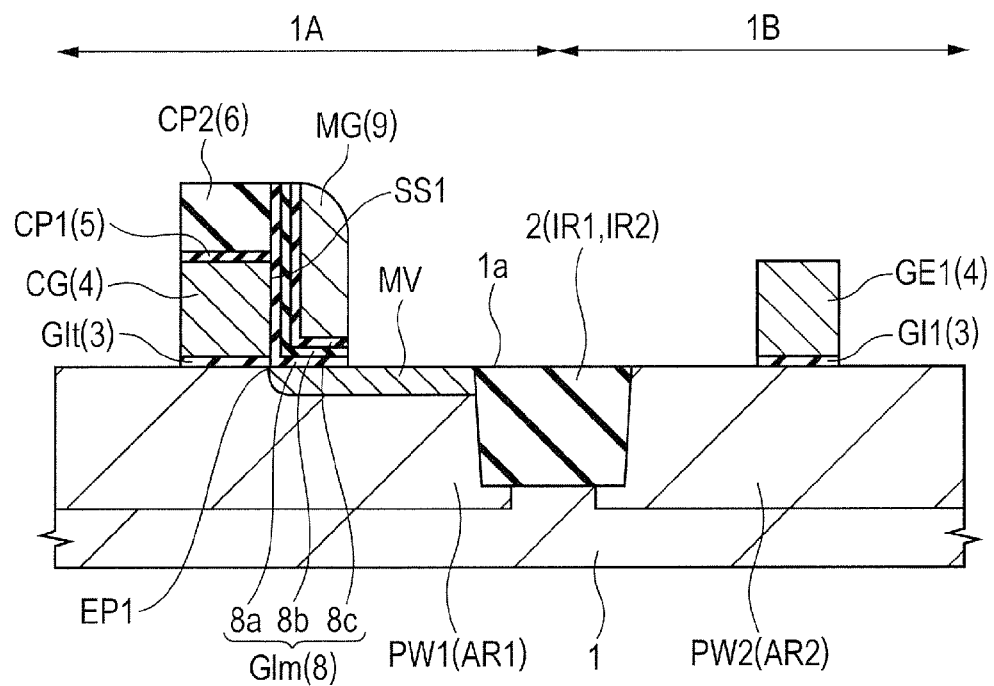
FIG. 34 is a sectional view showing a substantial part during a manufacturing step of the semiconductor device according to Comparative Example 2.

The position of an end of an n-type semiconductor region is explained hereunder in contradistinction to a manufacturing method of a semiconductor device according to Comparative Example 2. FIGS. 33 and 34 are sectional views showing a substantial part during manufacturing steps of a semiconductor device according to Comparative Example 2.

A manufacturing method of a semiconductor device according to Comparative Example 2 is a method of manufacturing a semiconductor device according to Comparative Example 2 through steps corresponding to Step S1 in FIG. 4 to Step S22 in FIG. 5.

In the manufacturing step of a semiconductor device according to Comparative Example 2, unlike the manufacturing step of a semiconductor device according to Embodiment 1, at a step corresponding to Step S7 in FIG. 4, sacrificial oxide films are formed only by an ISSG oxidation method without applying a thermal oxidation method.

As stated earlier, by an ISSG oxidation method, since radical oxidation reaction is applied, it is possible to oxidize also the surface of an insulating film 6 comprising a silicon nitride film in a peripheral circuit region 1B for example. For that reason, in the same manner as Embodiment 1, a sacrificial oxide film SOF3 is formed over the surface of a cap insulating film CP2 in a memory cell region 1A and a sacrificial oxide film SOF4 (refer to FIG. 11) is formed over the surface of the part, which remains in the peripheral circuit region 1B, of the insulating film 6. At a step corresponding to Step S8 in FIG. 4 therefore, when a resist film RF1 (refer to FIG. 12) is formed and the formed resist film RF1 is subjected to pattern exposure and thereafter development, a particle RT1 (refer to FIG. 13) as a foreign substance may sometimes be generated. On this occasion, the generated particle PT1 adheres to the top surface of the sacrificial oxide film SOF4 (refer to FIG. 13) in the peripheral circuit region 1B.

Further, in Comparative Example 2, in the same manner as Embodiment 1, the adhesiveness between the particle PT1 adhering to the top surface of the sacrificial oxide film SOF4 (refer to FIG. 13) and the top surface of the sacrificial oxide film SOF4 is small. Consequently, the particle PT1 easily breaks down from the top surface of the sacrificial oxide film SOF4 at the initial stage of the step of etching the insulating film 6 (refer to FIG. 14). As shown in FIG. 33 therefore, at the step of etching the insulating film 6, it is possible to completely remove the part, which remains in the peripheral circuit region 1B, of the insulating film 6. As shown in FIG. 34 therefore, at the step of patterning a conductive film 4 (Step S16 in FIG. 5), it is possible to prevent the conductive film 4 from remaining in the region other than the region where a gate electrode GE1 is to be formed in the peripheral circuit region 1B.

It is difficult however to make the film thickness TH1 of a sacrificial oxide film SOF1 formed over the side surfaces of a control gate electrode CG by an ISSG oxidation method larger than the film thickness TH1 (refer to FIG. 29) of a sacrificial oxide film SOF1 formed over the side surfaces of a control gate electrode CG by a thermal oxidation method. Consequently, the film thickness TH1 of the sacrificial oxide film formed over the side surfaces of the control gate electrode CG in the memory cell region 1A in Comparative Example 2 shown in FIG. 33 is smaller than the film thickness TH1 of the sacrificial oxide film SOF1 formed over the side surfaces of the control gate electrode CG in the memory cell region 1A in Comparative Example 1 shown in FIG. 29. That is, in Comparative Example 2 shown in FIG. 33, the film thickness TH1 of the sacrificial oxide film SOF1 formed over the side surfaces of the control gate electrode CG in the memory cell region 1A is nearly equal to the film thickness TH2 of the sacrificial oxide film SOF3 formed over the surface of the cap insulating film CP2 in the memory cell region 1A.

As shown in FIG. 33, in the memory cell region 1A, in the case where the film thickness TH1 of the sacrificial oxide film SOF1 formed over the side surfaces of the control gate electrode CG is small, impurities of the n-type are likely to be introduced up to the center of the control gate electrode CG when the impurities IP1 of the n-type are introduced into the p-type well PW1 by an ion implantation method by applying a step corresponding to Step S9 in FIG. 4. As a result, the end EP1 that is an end of the semiconductor region MV of the n-type formed at a step corresponding to Step S9 in FIG. 4 and an end on the center side of the control gate electrode CG is located on the side closer to the center of the control gate electrode CG than the side surface SS1 of the control gate electrode CG on the side of the memory gate electrode MG in plan view. In other words, the semiconductor region MV of the n-type overlaps with the control gate electrode CG and is not separated from the control gate electrode CG in plan view.

When data are written in the memory cell MC1 by source side injection, a voltage is applied between the memory gate electrode MG and the control gate electrode CG. Then electrons are injected from the part, which is in contact with the memory gate electrode MG with the gate insulating film GIm interposed, of the semiconductor region MV of the n-type into the silicon nitride film 8b in the gate insulating film GIm by source side injection and thereby the data are written in the memory cell MC1. In such a semiconductor device, a p-n junction is formed by the semiconductor region MV of the n-type and the p-type well PW1 in the vicinity of the end EP1 of the semiconductor region MV of the n-type on the center side of the control gate electrode CG. Then electrons are generated mainly at the p-n junction by applying a voltage between the memory gate electrode MG and the control gate electrode CG and the generated electrons are injected into the silicon nitride film 8b in the gate insulating film GIm.

Preferably, it is desirable to locate the end EP1 of the semiconductor region MV of the n-type closer to the memory gate electrode MG than the side surface SS1 of the control gate electrode CG on the side of the memory gate electrode MG in plan view. That is, it is desirable to form the semiconductor region MV of the n-type so as to be separated from the control gate electrode CG in plan view. As a result, it is possible to efficiently inject the electrons generated mainly at the p-n junction into the silicon nitride film 8b in the gate insulating film GIm by source side injection.

In the manufacturing step of a semiconductor device according to Comparative Example 1 stated earlier, the film thickness TH1 (refer to FIG. 29) of the sacrificial oxide film SOF1 formed over the side surfaces of the control gate electrode CG at a step corresponding to Step S7 in FIG. 4 is large. As a result, when the semiconductor region MV of the n-type is formed by applying a step corresponding to Step S9 in FIG. 4, it is possible to arrange the end EP1 (refer to FIG. 31) of the formed semiconductor region MV of the n-type closer to the memory gate electrode MG than the side surface SS1 of the control gate electrode CG on the side of the memory gate electrode MG in plan view. Consequently, when data are written in the memory cell MC1, it is possible to efficiently inject the electrons generated in the vicinity of the end EP1 of the semiconductor region MV of the n-type from the part, which is in contact with the memory gate electrode MG with the gate insulating film GIm interposed, of the semiconductor region MV of the n-type into the gate insulating film GIm by source side injection.

Further, in the manufacturing step of a semiconductor device according to Comparative Example 2, the film thickness TH1 (refer to FIG. 33) of the sacrificial oxide film SOF1 formed over the side surfaces of the control gate electrode CG at a step corresponding to Step S7 in FIG. 4 is small. As a result, when the semiconductor region MV of the n-type is formed by applying a step corresponding to Step S9 in FIG. 4, it is impossible to arrange the end EP1 of the formed semiconductor region MV of the n-type closer to the memory gate electrode MG than the side surface SS1 of the control gate electrode CG on the side of the memory gate electrode MG in plan view.

That is, the end EP1 of the formed semiconductor region MV of the n-type is located on the side closer to the center of the control gate electrode CG than the side surface SS1 of the control gate electrode CG on the side of the memory gate electrode MG in plan view. In other words, the semiconductor region MV of the n-type overlaps with the control gate electrode CG and is not separated from the control gate electrode CG in plan view. Consequently, when data are written in the memory cell MC1, it is impossible to efficiently inject the electrons generated in the vicinity of the end EP1 of the semiconductor region MV of the n-type into the gate insulating film GIm by source side injection.

In contrast, the film thickness TH1 (refer to FIG. 11) of the sacrificial oxide film SOF1 formed over the side surfaces of the control gate electrode CG at the manufacturing step of a semiconductor device according to Embodiment 1 is large similarly to the film thickness TH1 (refer to FIG. 29) of the sacrificial oxide film SOF1 formed over the side surfaces of the control gate electrode CG at the manufacturing step of a semiconductor device according to Comparative Example 1. That is, in the manufacturing step of a semiconductor device according to Embodiment 1, at Step S7 in FIG. 4, the film thickness TH1 (refer to FIG. 11) of the sacrificial oxide film formed over the side surfaces of the control gate electrode CG is larger than the film thickness TH2 (refer to FIG. 11) of the sacrificial oxide film SOF3 formed over the surface of the cap insulating film CP2.

As a result, when the semiconductor region MV of the n-type is formed by applying Step S9 in FIG. 4, it is possible to arrange the end EP1 of the formed semiconductor region MV of the n-type closer to the memory gate electrode MG than the side surface SS1 of the control gate electrode CG on the side of the memory gate electrode MG in plan view. That is, the end EP1 of the formed semiconductor region MV of the n-type is located on the side, the side being opposite to the center side of the control gate electrode CG, of the side surface SS1 of the control gate electrode CG on the side of the memory gate electrode MG in plan view. In other words, the semiconductor region MV of the n-type does not overlap with the control gate electrode CG and is formed so as to be separated from the control gate electrode CG in plan view. Consequently, when data are written in the memory cell MC1, it is possible to efficiently inject the electrons generated in the vicinity of the end EP1 of the semiconductor region MV of the n-type into the gate insulating film GIm by source side injection.

<Principal Features and Effects of Present Embodiment>

In the manufacturing method of a semiconductor device according to Embodiment 1, a conductive film 4 comprising silicon and an insulating film 6 containing silicon and nitrogen are formed over a semiconductor substrate 1 in a memory cell region 1A and a peripheral circuit region 1B. Successively, the insulating film 6 and the conductive film 4 are patterned in the memory cell region 1A, a control gate electrode CG comprising the conductive film 4 is formed, and a cap insulating film CP2 comprising the insulating film 6 over the control gate electrode CG is formed. Successively, sacrificial oxide films SOF1, SOF3, and SOF4 are formed over the side surfaces of the control gate electrode CG, the surface of the cap insulating film CP2, and the surface of the part, which remains in the peripheral circuit region 1B, of the insulating film 6. The step of forming the sacrificial oxide films SOF1, SOF3, and SOF4 includes the step of oxidizing the side surfaces of the control gate electrode CG by a thermal oxidation method and the step of oxidizing the surface of the cap insulating film CP2 and the surface of the part, which remains in the peripheral circuit region 1B, of the insulating film 6 by an ISSG oxidation method. Successively, in the peripheral circuit region 1B, the insulating film 6 is removed, the conductive film 4 is patterned, and a gate electrode GE1 comprising the conductive film 4 is formed.

As a result, it is possible to easily remove a foreign substance adhering to the part, which remains in the peripheral circuit region 1B, of the insulating film 6 after the control gate electrode CG and the cap insulating film CP2 are formed and before the part, which remains in the peripheral circuit region 1B, of the insulating film 6 is removed in comparison with the case where the step of forming the sacrificial oxide films includes only the step of apply oxidation by a thermal oxidation method. Concretely, when a resist film RF1 is patterned and the resist film RF1 is removed in the peripheral circuit region 1B after the control gate electrode CG and the cap insulating film CP2 are formed for example, it is possible to easily remove a foreign substance adhering to the part, which remains in the peripheral circuit region 1B, of the insulating film 6. As a result, it is possible to prevent or inhibit the semiconductor device from being damaged in comparison with the case where the step of forming the sacrificial oxide films includes only the step of applying oxidation by a thermal oxidation method.

Further, in comparison with the case where the step of forming the sacrificial oxide films includes only the step of apply oxidation by an ISSG oxidation method, it is possible to: increase the film thickness TH1 of the sacrificial oxide film SOF1 formed over the side surfaces of the control gate electrode CG; and form a semiconductor region MV of the n-type so as to be separated from the control gate electrode CG in plan view. As a result, in comparison with the case where the step of forming the sacrificial oxide films includes only the step of applying oxidation by an ISSG oxidation method, when data are written in a memory cell MC1, it is possible to efficiently inject the electrons generated in the vicinity of the end EP1 of the semiconductor region MV of the n-type into a gate insulating film GIm by source side injection.

Further, in Embodiment 1, the step of applying oxidation by an ISSG oxidation method is applied before the gate electrode GE1 of a MISFET Q1 is formed in the peripheral circuit region 1B. As a result, it is possible to: prevent or inhibit the side surface of the gate electrode GE1 from being oxidized in the peripheral circuit region 1B by applying an ISSG oxidation method; and prevent or inhibit the performance of the MISFET Q1 from varying in the peripheral circuit region 1B.

Here, in Embodiment 1, at the step of forming the sacrificial oxide films, it is possible to apply the step of applying oxidation by a thermal oxidation method before oxidation is applied by an ISSG oxidation method. As a result, it is possible to form the sacrificial oxide film SOF1 having a film thickness TH1 larger than the film thickness TH2 of the sacrificial oxide film SOF3 formed over the surface of the cap insulating film CP2 over the side surfaces of the control gate electrode CG without fail.

Embodiment 2

In the manufacturing method of a semiconductor device according to Embodiment 1, oxidation is applied by an ISSG oxidation method after oxidation is applied by a thermal oxidation method when sacrificial oxide films are formed. In contrast, in the manufacturing method of a semiconductor device according to Embodiment 2, oxidation is applied by a thermal oxidation method after oxidation is applied by an ISSG oxidation method when sacrificial oxide films are formed.

Here, the structure of a semiconductor device according to Embodiment 2 is similar to the structure of a semiconductor device according to Embodiment 1.

<Manufacturing Step of Semiconductor Device>

Figure 35:
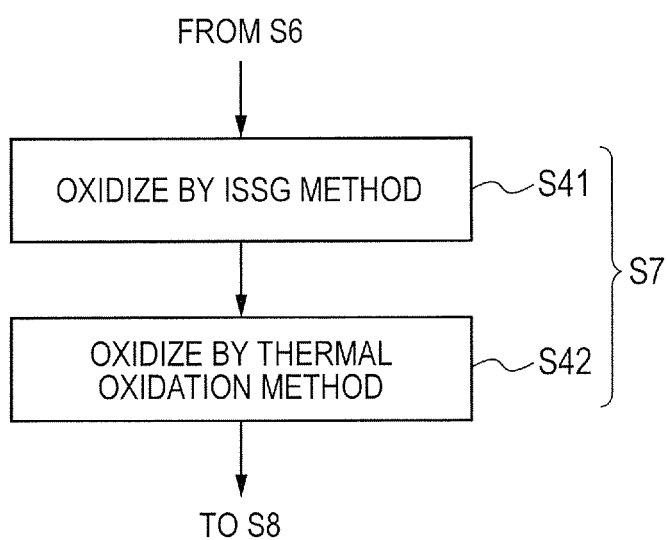
FIG. 35 is a process flow diagram showing a part of a manufacturing step of a semiconductor device according to Embodiment 2.
Figure 36:
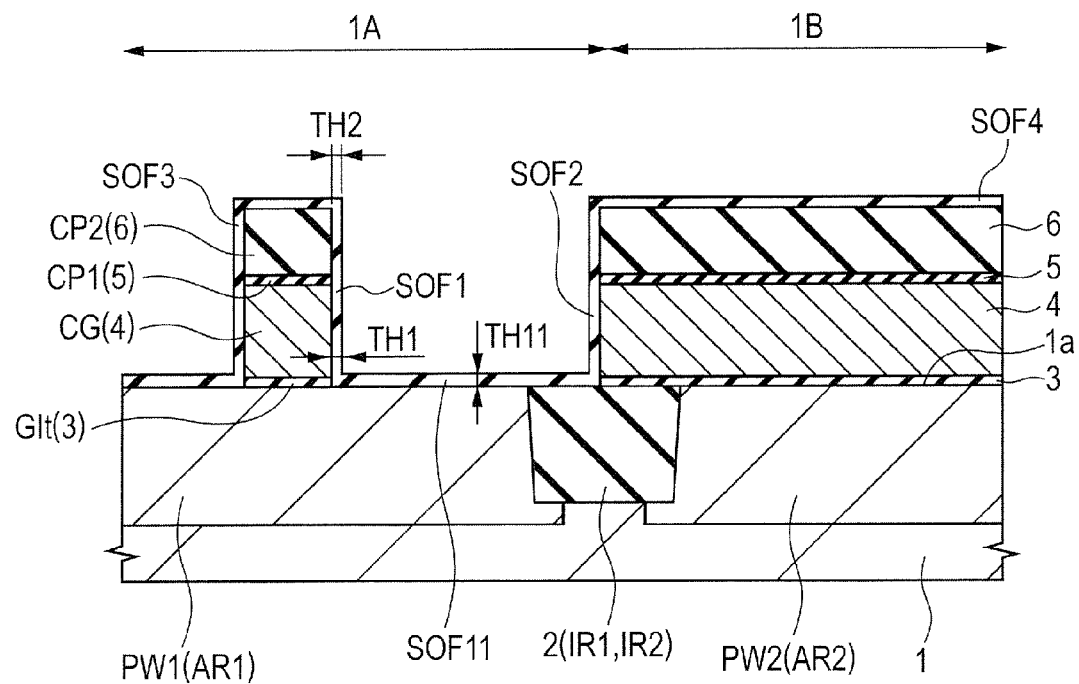
FIG. 36 is a sectional view showing a substantial part during a manufacturing step of a semiconductor device according to Embodiment 2.
Figure 37:
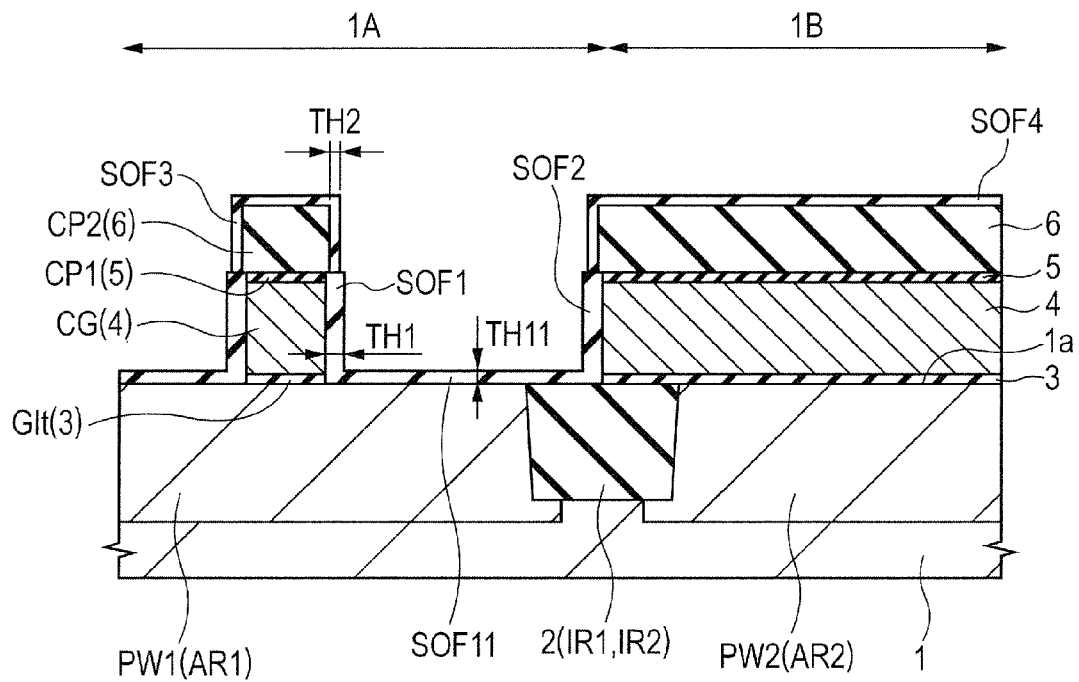
FIG. 37 is a sectional view showing a substantial part during a manufacturing step of the semiconductor device according to Embodiment 2.

FIG. 35 is a process flow diagram showing a part of a manufacturing step of a semiconductor device according to Embodiment 2. FIGS. 36 and 37 are sectional views showing a substantial part during manufacturing steps of a semiconductor device according to Embodiment 2. FIG. 35 shows steps included in Step S7 in FIG. 4. In the sectional views of FIGS. 36 and 37, the sectional views of a substantial part in a memory cell region 1A and a peripheral circuit region 1B are shown and the situations of forming a memory cell MC1 (refer to FIG. 26) in the memory cell region 1A and a MISFET Q1 (refer to FIG. 26) in the peripheral circuit region 1B respectively are shown.

In Embodiment 2, an insulating film 6, an insulating film 5, and a conductive film 4 are patterned by applying Steps S1 to S6 in FIG. 4 in the same manner as Embodiment 1.

Successively, sacrificial oxide films SOF1, SOF2, SOF3, and SOF4 are formed by applying Step S7 in FIG. 4.

In Embodiment 2, firstly as shown in FIG. 36, oxidation is applied by an ISSG oxidation method (Step S41 in FIG. 35), unlike Embodiment 1.

By the ISSG oxidation method, since radical oxidation reaction is applied, the surface of the conductive film 4 comprising a silicon film is oxidized for example. As a result, at Step S41, the side surfaces of a control gate electrode CG comprising the conductive film 4 are oxidized and the sacrificial oxide film SOF1 is formed over the side surfaces of the control gate electrode CG. Further, at Step S41, the side surface of the part, which remains in a peripheral circuit region 1B, of the conductive film 4 is oxidized and the sacrificial oxide film SOF2 is formed over the side surface of the part, which remains in a peripheral circuit region 1B, of the conductive film 4.

Meanwhile, by the ISSG oxidation method, since radical oxidation reaction is applied, the surface of the insulating film 6 comprising a silicon nitride film can also be oxidized for example. As a result, at Step S41, the surface of a cap insulating film CP2 comprising the insulating film 6 is oxidized and the sacrificial oxide film SOF3 is formed over the surface of the cap insulating film CP2. Further at Step S41, the surface of the part, which remains in the peripheral circuit region 1B, of the insulating film 6 is oxidized and the sacrificial oxide film SOF4 is formed over the surface of the part, which remains in the peripheral circuit region 1B, of the insulating film 6.

That is, at Step S41, the side surfaces of the control gate electrode CG, the side surface of the part, which remains in the peripheral circuit region 1B, of the conductive film 4, the surface of the cap insulating film CP2, and the surface of the part, which remain in the peripheral circuit region 1B, of the insulating film 6 are oxidized by the ISSG oxidation method.

Here, at Step S41, in the memory cell region 1A, the top surface of a p-type well PW1 is oxidized and a sacrificial oxide film SOF11 is also formed over the top surface of the p-type well PW1.

At Step S41, it is possible to apply oxidation at a temperature of about 900° C. by the ISSG oxidation method for example. On this occasion, it is possible to: set the film thickness TH1 of the sacrificial oxide film SOF1 at about 1 nm for example; set the film thickness TH11 of the sacrificial oxide film SOF11 at about 1 nm for example; and set the film thickness TH2 of the sacrificial oxide film SOF3 at about 1 nm for example. Further, it is possible to: set the film thickness of the sacrificial oxide film SOF2 at a film thickness comparable to the film thickness of the sacrificial oxide film SOF1; and set the film thickness of the sacrificial oxide film SOF4 at a film thickness comparable to the film thickness of the sacrificial oxide film SOF3.

Successively, as shown in FIG. 37, oxidation is applied by a thermal oxidation method (Step S42 in FIG. 35).

By the thermal oxidation method, the surface of the conductive film 4 comprising a silicon film is likely to be oxidized for example. As a result, at Step S42, the side surfaces of the control gate electrode CG comprising the conductive film 4 are oxidized further and the film thickness TH1 of the sacrificial oxide film SOF1 formed over the side surfaces of the control gate electrode CG increases. Further at Step S42, the side surface of the part, which remains in the peripheral circuit region 1B, of the conductive film 4 is oxidized and the film thickness of the sacrificial oxide film SOF2 formed over the side surface of the part, which remains in the peripheral circuit region 1B, of the conductive film 4 increases.

That is, at Step S42, the side surfaces of the control gate electrode CG and the side surface of the part, which remains in the peripheral circuit region 1B, of the conductive film 4 are oxidized further by the thermal oxidation method.

Here, at Step S42, in the memory cell region 1A, the top surface of the p-type well PW1 is oxidized further and the film thickness of the sacrificial oxide film SOF11 formed over the top surface of the p-type well PW1 increases.

As stated earlier, the surface of the conductive film 4 is likely to be oxidized by introducing impurities of the n-type into the conductive film 4 or the like and hence the surface of the p-type well PW1 is hardly oxidized in comparison with the surface of the conductive film 4 for example. Consequently, in the memory cell region 1A, the film thickness TH11 of the sacrificial oxide film SOF11 formed over the top surface of the p-type well PW1 in the semiconductor substrate 1 is smaller than the film thickness TH1 of the sacrificial oxide film SOF1 formed over the side surfaces of the control gate electrode CG comprising the conductive film 4.

Meanwhile, by the thermal oxidation method, the surface of the insulating film 6 comprising a silicon nitride film is hardly oxidized for example. As a result, at Step S42, the film thickness TH2 of the sacrificial oxide film SOF3 formed over the surface of the cap insulating film CP2 comprising the insulating film 6 does not increase. Further, at Step S42, the film thickness of the sacrificial oxide film SOF4 formed over the surface of the part, which remains in the peripheral circuit region 1B, of the insulating film 6 does not increase.

At Step S42, it is possible to apply oxidation at a temperature of about 950° C. by the thermal oxidation method for example. On this occasion, it is possible to: increase the film thickness TH1 of the sacrificial oxide film SOF1 to about 6 nm for example; and increase the film thickness TH11 of the sacrificial oxide film SOF11 to about 4 nm for example. In contrast, the film thickness TH2 of the sacrificial oxide film SOF3 is not different from the film thickness TH2 at Step S41 and is about 1 nm for example.

Successively, in the same manner as Embodiment 1, by applying Step S8 in FIG. 4 to Step S22 in FIG. 5, the semiconductor device according to Embodiment 2 is manufactured.

<Principal Features and Effects of Present Embodiment>

In the manufacturing method of a semiconductor device according to Embodiment 2, in the same manner as Embodiment 1, the step of forming sacrificial oxide films includes the steps of: oxidizing the side surfaces of a control gate electrode CG by a thermal oxidation method; and oxidizing the surface of a cap insulating film CP2 and the surface of the part, which remains in a peripheral circuit region 1B, of an insulating film 6 by an ISSG oxidation method. As a result, the manufacturing method of a semiconductor device according to Embodiment 2 has effects similar to the manufacturing method of a semiconductor device according to Embodiment 1.

Further, in Embodiment 2, at the step of forming sacrificial oxide films, a step of applying oxidation by an ISSG oxidation method is applied before oxidation is applied by a thermal oxidation method. As a result, the time when a sacrificial oxide film SOF3 is formed over the surface of a cap insulating film CP2 is ahead of the time when a sacrificial oxide film SOF3 is formed over the surface of a cap insulating film CP2 in the manufacturing method of a semiconductor device according to Embodiment 1. As a result, it is possible to more definitely prevent or inhibit a foreign substance from adhering to the part, which remains in a peripheral circuit region 1B, of an insulating film 6 after a control gate electrode CG and a cap insulating film CP2 are formed and before the part, which remains in the peripheral circuit region 1B, of the insulating film 6 is removed. Concretely, it is also possible to prevent or inhibit a particle PT1 (refer to FIG. 13) as a foreign substance generated at a time earlier than the time when a resist film RF1 is formed after a control gate electrode CG and a cap insulating film CP2 are formed and before the part, which remains in a peripheral circuit region 1B, of an insulating film 6 is removed from adhering to the surface of the insulating film 6.

Although the invention established by the present inventors has heretofore been explained concretely on the basis of the embodiments, it goes without saying that the present invention is not limited to the embodiments and can be modified variously within the scope not departing from the tenor of the present invention.

What is claimed is:

1. A manufacturing method of a semiconductor device, comprising the steps of:
   (a) providing a semiconductor substrate;
   (b) forming a first insulating film over a first main surface of said semiconductor substrate in a first region over said first main surface of said semiconductor substrate and in a second region over said first main surface of said semiconductor substrate;
   (c) forming a first conductive film comprised of silicon over said first insulating film in said first region and said second region;
   (d) forming a second insulating film containing silicon and nitrogen over said first conductive film in said first region and said second region;
   (e) patterning said second insulating film and said first conductive film, forming a first gate electrode comprised of said first conductive film in said first region, forming a first gate insulating film comprised of said first insulating film between said first gate electrode and said semiconductor substrate, forming a first cap insulating film comprised of said second insulating film over said first gate electrode, and leaving said second insulating film and said first conductive film in said second region;
   (f) oxidizing the side surface of said first gate electrode, the surface of said first cap insulating film, and the surface of the part, which remains in said second region, of said second insulating film, forming a first oxide film over the side surface of said first gate electrode, forming a second oxide film over the surface of said first cap insulating film, and forming a third oxide film over the surface of the part, which remains in said second region, of said second insulating film;
   (g) removing said third oxide film and the part, which remains in said second region, of said second insulating film;
   (h) after said step (g), removing said first oxide film and said second oxide film; and
   (i) after said step (h), patterning the part, which remains in said second region, of said first conductive film, forming a second gate electrode comprised of said first conductive film in said second region, and forming a second gate insulating film comprised of said first insulating film between said second gate electrode and said semiconductor substrate, wherein said step (f) includes the steps of:
   (f1) oxidizing the side surface of said first gate electrode by a thermal oxidation method; and
   (f2) oxidizing the surface of said first cap insulating film and the surface of the part, which remains in said second region, of said second insulating film by an ISSG oxidation method.

2. A manufacturing method of a semiconductor device according to claim 1, including the steps of:
   (j) after said step (f), forming a resist film so as to cover said first gate electrode, said first cap insulating film, and the part, which remains in said second region, of said second insulating film in said first region and said second region;
   (k) patterning said resist film, removing said resist film in said second region, and leaving said resist film in said first region; and
   (l) removing the part, which remains in said first region, of said resist film,
   wherein at said step (g), after said step (k), said third oxide film and the part, which remains in said second region, of said second insulating film are removed,
   wherein at said step (l), after said step (g), the part, which remains in said first region, of said resist film is removed, and
   wherein at said step (h), after said step (l), said first oxide film and said second oxide film are removed.

3. A manufacturing method of a semiconductor device according to claim 1, wherein, at said step (f2), after said step (f1), the surface of said first cap insulating film and the surface of the part, which remains in said second region, of said second insulating film are oxidized by said ISSG oxidation method.

4. A manufacturing method of a semiconductor device according to claim 1,
   wherein at said step (f2), the side surface of said first gate electrode is oxidized by said ISSG oxidation method, and
   wherein at said step (f1), after said step (f2), the side surface of said first gate electrode is oxidized by said thermal oxidation method.

5. A manufacturing method of a semiconductor device according to claim 1,
   wherein said step (i) includes the steps of:
   (i1) forming a third insulating film having a charge accumulation section therein over said first main surface of said semiconductor substrate, the side surface of said first gate electrode, and the surface of said first cap insulating film, in said first region;
   (i2) forming a second conductive film over said third insulating film;

(i3) leaving said second conductive film and forming a third gate electrode over the sidewall of said first gate electrode via said third insulating film, by etching back said second conductive film; and (i4) removing the part, which is not covered with said third gate electrode, of said third insulating film and leaving said third insulating film between said third gate electrode and said semiconductor substrate and between said first gate electrode and said third gate electrode.

6. A manufacturing method of a semiconductor device according to claim 5, wherein at said step (a), said semiconductor substrate having a first semiconductor region of a first conductive type formed over said first main surface in said first region is provided, wherein at said step (b), said first insulating film is formed over said first semiconductor region in said first region, wherein at said step (c), said first conductive film is formed over the part, which is formed over said first semiconductor region, of said first insulating film, wherein at said step (d), said second insulating film is formed over the part, which is formed over said first semiconductor region via said first insulating film, of said first conductive film, wherein at said step (e), said first gate electrode comprising the part, which is formed over said first semiconductor region via said first insulating film, of said first conductive film is formed, wherein at said step (i3), said second conductive film remains and said third gate electrode is formed over a first sidewall that is the sidewall on a first side of said first gate electrode via said third insulating film, by etching back said second conductive film, said manufacturing method of said semiconductor device further including a step of:

(m) after said step (f), introducing impurities of a second conductive type opposite to said first conductive type into said first semiconductor region by an ion implantation method with said first cap insulating film and said first gate electrode used as masks and forming a second semiconductor region of said second conductive type at the upper layer part of the part, which is located on said first side of said first gate electrode, of said first semiconductor region in plan view, wherein at said step (h), after said step (m), said first oxide film and said second oxide film are removed.

7. A manufacturing method of a semiconductor device according to claim 6, wherein, at said step (m), said second semiconductor region is formed so as to be separated from said first gate electrode in plan view.

8. A manufacturing method of a semiconductor device according to claim 6, including a step of:

(n) after said step (m), in said first region, introducing impurities of said second conductive type into said first semiconductor region with said first cap insulating film, said first gate electrode, and said third gate electrode used as masks, forming a third semiconductor region of said second conductive type at the upper layer part of the part, which is located on the side opposite to said first gate electrode via said third gate electrode, of said first semiconductor region in plan view, and forming a fourth semiconductor region of said second conductive type at the upper layer part of the part, which is located on the side opposite to said third gate electrode via said first gate electrode, of said first semiconductor region in plan view, and wherein said third semiconductor region is in contact with said second semiconductor region.

9. A manufacturing method of a semiconductor device according to claim 5, wherein said third insulating film includes a first silicon oxide film, a first silicon nitride film over said first silicon oxide film, and a second silicon oxide film over said first silicon nitride film, and wherein said step (i1) includes the steps of:

(i5) forming said first silicon oxide film over said first main surface of said semiconductor substrate, the side surface of said first gate electrode, and the surface of said first cap insulating film;

(i6) forming said first silicon nitride film over said first silicon oxide film; and (i7) forming said second silicon oxide film over said first silicon nitride film.

10. A manufacturing method of a semiconductor device according to claim 6, wherein, at said step (f1) or said step (f2), a fourth oxide film is formed over the part, which is located on said first side of said first gate electrode, of said first semiconductor region.

11. A manufacturing method of a semiconductor device according to claim 6, wherein said semiconductor device has a nonvolatile memory, and wherein said nonvolatile memory is comprised of said first gate electrode and said third gate electrode.

12. A manufacturing method of a semiconductor device according to claim 11, wherein at said step (i4), a third gate insulating film comprising the parts, which remain between said third gate electrode and said semiconductor substrate and between said first gate electrode and said third gate electrode, of said third insulating film is formed, wherein said nonvolatile memory is comprised of said first gate electrode, said first gate insulating film, said third gate electrode, and said third gate insulating film, and wherein data are written in said nonvolatile memory by applying a voltage between said first gate electrode and said third gate electrode and injecting electrons from the part, which is in contact with said third gate electrode via said third gate insulating film, of said second semiconductor region into said third gate insulating film.

13. A manufacturing method of a semiconductor device according to claim 1, wherein, at said step (f1), the side surface of said first gate electrode is oxidized by a dry oxidation method or a wet oxidation method as said thermal oxidation method.

14. A manufacturing method of a semiconductor device according to claim 1, wherein said second insulating film is comprised of a silicon nitride film.

15. A manufacturing method of a semiconductor device according to claim 1, wherein said first conductive film is comprised of a polycrystal silicon film.

* * * * *